(12) United States Patent
Reid et al.

(10) Patent No.: US 10,006,144 B2
(45) Date of Patent: Jun. 26, 2018

(54) METHOD AND APPARATUS FOR FILLING INTERCONNECT STRUCTURES

(71) Applicant: Novellus Systems, Inc., Fremont, CA (US)

(72) Inventors: Jonathan D. Reid, Sherwood, OR (US); Huanfeng Zhu, West Linn (CA)

(73) Assignee: Novellus Systems, Inc., Fremont, CA (US)

( * ) Notice: Subject to any disclaimer, the term of this patent is extended or adjusted under 35 U.S.C. 154(b) by 0 days. days.

(21) Appl. No.: 14/051,184

(22) Filed: Oct. 10, 2013

(65) Prior Publication Data

US 2014/0138239 A1  May 22, 2014

Related U.S. Application Data

(62) Division of application No. 13/108,894, filed on May 16, 2011, now Pat. No. 8,575,028.
(Continued)

(51) Int. Cl.
*C25D 21/12* (2006.01)
*C25D 3/38* (2006.01)
(Continued)

(52) U.S. Cl.
CPC ............ *C25D 21/12* (2013.01); *C25D 7/123* (2013.01); *C25D 17/001* (2013.01); *C25D 17/008* (2013.01); *H01L 21/2885* (2013.01); *H01L 21/6723* (2013.01); *H01L 21/76864* (2013.01); *H01L 21/76882* (2013.01); *C25D 3/38* (2013.01)

(58) Field of Classification Search
CPC .... C25D 3/38; C25D 5/48; C25D 3/42; C25C 1/12
USPC .......................... 204/242; 205/169, 182, 291
See application file for complete search history.

(56) References Cited

U.S. PATENT DOCUMENTS 1,969,553 A  8/1934  Gernes
3,652,442 A  3/1972  Powers et al.
(Continued)

FOREIGN PATENT DOCUMENTS

CN      1582491 A    2/2005
CN    101925981 A   12/2010
(Continued)

OTHER PUBLICATIONS

U.S. Appl. No. 13/367,710, filed Feb. 7, 2012, entitled "Copper Electroplating Process for Uniform Across Wafer Deposition and Void Free Filling on Ruthenium Coated Wafers".
(Continued)

*Primary Examiner* — Zulmariam Mendez
(74) *Attorney, Agent, or Firm* — Weaver Austin Villeneuve & Sampson LLP

(57) ABSTRACT

Methods, apparatus, and systems for depositing copper and other metals are provided. In some implementations, a wafer substrate is provided to an apparatus. The wafer substrate has a surface with field regions and a feature. A copper layer is plated onto the surface of the wafer substrate. The copper layer is annealed to redistribute copper from regions of the wafer substrate to the feature. Implementations of the disclosed methods, apparatus, and systems allow for void-free bottom-up fill of features in a wafer substrate.

23 Claims, 13 Drawing Sheets

Related U.S. Application Data

(60) Provisional application No. 61/476,091, filed on Apr. 15, 2011.

(51) Int. Cl.
*C25D 7/12* (2006.01)
*C25D 17/00* (2006.01)
*H01L 21/288* (2006.01)
*H01L 21/67* (2006.01)
*H01L 21/768* (2006.01)

(56) References Cited

U.S. PATENT DOCUMENTS

| | | | |
|---|---|---|---|
| 3,706,651 A | 12/1972 | Leland | |
| 3,862,891 A | 1/1975 | Smith | |
| 4,033,833 A | 7/1977 | Bestel et al. | |
| 4,082,638 A | 4/1978 | Jumer | |
| 4,240,886 A | 12/1980 | Hodges et al. | |
| 4,272,335 A | 6/1981 | Combs | |
| 4,304,641 A | 12/1981 | Grandia et al. | |
| 4,357,220 A | 11/1982 | Eisenmann | |
| 4,469,564 A | 9/1984 | Okinaka et al. | |
| 4,604,177 A | 8/1986 | Sivilotti | |
| 4,604,178 A | 8/1986 | Fiegener et al. | |
| 4,605,482 A | 8/1986 | Shirgami et al. | |
| 4,696,729 A | 9/1987 | Santini | |
| 4,828,654 A | 5/1989 | Reed | |
| 4,906,346 A | 3/1990 | Hadersbeck et al. | |
| 4,931,149 A | 6/1990 | Stierman et al. | |
| 4,933,061 A | 6/1990 | Kulkarni et al. | |
| 5,039,381 A | 8/1991 | Mullarkey | |
| 5,096,550 A | 3/1992 | Mayer et al. | |
| 5,146,136 A | 9/1992 | Ogura et al. | |
| 5,156,730 A | 10/1992 | Bhatt et al. | |
| 5,162,079 A | 11/1992 | Brown | |
| 5,217,586 A | 6/1993 | Datta et al. | |
| 5,316,642 A | 5/1994 | Young, Jr. et al. | |
| 5,368,711 A | 11/1994 | Poris | |
| 5,391,285 A | 2/1995 | Lytle et al. | |
| 5,421,987 A | 6/1995 | Tzanavaras et al. | |
| 5,443,707 A | 8/1995 | Mori | |
| 5,452,053 A | 9/1995 | Nozue | |
| 5,472,592 A | 12/1995 | Lowery | |
| 5,476,578 A | 12/1995 | Forand | |
| 5,498,325 A | 3/1996 | Nishimura et al. | |
| 5,516,412 A | 5/1996 | Andricacos et al. | |
| 5,567,300 A | 10/1996 | Datta et al. | |
| 5,877,087 A | 3/1999 | Mosely et al. | |
| 5,913,147 A | 6/1999 | Dublin et al. | |
| 5,935,402 A | 8/1999 | Fanti | |
| 5,982,606 A | 11/1999 | Masuda et al. | |
| 6,027,631 A | 2/2000 | Broadbent | |
| 6,113,771 A | 9/2000 | Landau et al. | |
| 6,126,798 A | 10/2000 | Reid et al. | |
| 6,132,587 A | 10/2000 | Jorne et al. | |
| 6,136,707 A | 10/2000 | Cohen | |
| 6,156,167 A | 12/2000 | Patton et al. | |
| 6,179,983 B1 | 1/2001 | Reid et al. | |
| 6,193,860 B1 | 2/2001 | Weling | |
| 6,197,181 B1 | 3/2001 | Chen | |
| 6,297,157 B1 | 10/2001 | Lopatin et al. | |
| 6,303,014 B1 | 10/2001 | Taylor et al. | |
| 6,350,366 B1 | 2/2002 | Landau et al. | |
| 6,391,166 B1 | 5/2002 | Wang | |
| 6,395,152 B1 | 5/2002 | Wang | |
| 6,402,923 B1 | 6/2002 | Mayer et al. | |
| 6,409,903 B1 | 6/2002 | Chung et al. | |
| 6,497,801 B1 | 12/2002 | Woodruff et al. | |
| 6,527,920 B1 | 3/2003 | Mayer et al. | |
| 6,569,299 B1 | 5/2003 | Reid et al. | |
| 6,664,122 B1 | 12/2003 | Andryuschenko et al. | |
| 6,692,588 B1 | 2/2004 | Uzoh et al. | |
| 6,755,954 B2 | 6/2004 | Mayer et al. | |
| 6,773,571 B1 | 8/2004 | Mayer et al. | |
| 6,783,611 B2 | 8/2004 | Yajima et al. | |
| 6,800,187 B1 | 10/2004 | Reid et al. | |
| 6,815,349 B1 | 11/2004 | Minshall et al. | |
| 7,033,465 B1 | 4/2006 | Patton et al. | |
| 7,070,686 B2 | 7/2006 | Contolini et al. | |
| 7,189,650 B2 * | 3/2007 | Liu | C25D 3/38 |
| | | | 257/E21.175 |
| 7,232,513 B1 | 6/2007 | Webb et al. | |
| 7,456,102 B1 | 11/2008 | Varadarajan et al. | |
| 7,622,024 B1 | 11/2009 | Mayer et al. | |
| 7,682,498 B1 | 3/2010 | Mayer et al. | |
| 7,799,684 B1 | 9/2010 | Reid et al. | |
| 7,897,198 B1 | 3/2011 | Park et al. | |
| 7,964,506 B1 | 6/2011 | Ponnuswamy et al. | |
| 8,308,931 B2 | 11/2012 | Reid et al. | |
| 8,475,644 B2 | 7/2013 | Mayer et al. | |
| 8,513,124 B1 | 8/2013 | Ponnuswamy et al. | |
| 8,575,028 B2 | 11/2013 | Reid et al. | |
| 8,703,615 B1 | 4/2014 | Ponnuswamy et al. | |
| 2002/0008034 A1 | 1/2002 | Chen et al. | |
| 2002/0195352 A1 | 12/2002 | Mayer et al. | |
| 2003/0087522 A1 | 5/2003 | Ngo et al. | |
| 2003/0102210 A1 | 6/2003 | Woodruff et al. | |
| 2003/0199156 A1 | 10/2003 | Fujii | |
| 2004/0061919 A1 | 4/2004 | Tench et al. | |
| 2004/0065540 A1 | 4/2004 | Mayer et al. | |
| 2004/0072423 A1 | 4/2004 | Jorne et al. | |
| 2004/0200244 A1 | 10/2004 | Hong et al. | |
| 2005/0006245 A1 | 1/2005 | Sun et al. | |
| 2005/0009325 A1 | 1/2005 | Chung et al. | |
| 2005/0173252 A1 | 8/2005 | Chen | |
| 2005/0208754 A1 | 9/2005 | Kostamo et al. | |
| 2006/0079084 A1 | 4/2006 | Baskaran et al. | |
| 2006/0178007 A1 | 8/2006 | Nakamura et al. | |
| 2006/0266655 A1 | 11/2006 | Sun et al. | |
| 2006/0283716 A1 | 12/2006 | Hafezi et al. | |
| 2007/0062818 A1 | 3/2007 | Daviot et al. | |
| 2007/0238265 A1 | 10/2007 | Kurashina et al. | |
| 2008/0213994 A1 | 9/2008 | Chebiam et al. | |
| 2008/0242088 A1 | 10/2008 | Suzuki | |
| 2009/0277867 A1 | 11/2009 | Mayer et al. | |
| 2009/0280649 A1 | 11/2009 | Mayer et al. | |
| 2010/0032304 A1 | 2/2010 | Mayer et al. | |
| 2010/0032310 A1 | 2/2010 | Reid et al. | |
| 2010/0041226 A1 | 2/2010 | Reid et al. | |
| 2010/0044236 A1* | 2/2010 | Mayer et al. | 205/80 |
| 2010/0317178 A1 | 12/2010 | Antonelli et al. | |
| 2012/0261254 A1 | 10/2012 | Reid et al. | |
| 2012/0264290 A1 | 10/2012 | Reid et al. | |
| 2014/0124361 A1 | 5/2014 | Reid et al. | |
| 2015/0053565 A1 | 2/2015 | Zhu et al. | |
| 2015/0218724 A1 | 8/2015 | Mevellec et al. | |
| 2015/0299886 A1 | 10/2015 | Doubina et al. | |

FOREIGN PATENT DOCUMENTS

| | | |
|---|---|---|
| EP | 0037325 | 3/1981 |
| JP | 59-162298 | 9/1984 |
| JP | 09-53197 | 2/1997 |
| JP | 2001316887 | 11/2001 |
| TW | 201027668 | 7/2010 |
| WO | WO/9941434 | 8/1999 |
| WO | WO 2014/044942 | 3/2014 |

OTHER PUBLICATIONS

U.S. Appl. No. 14/010,404, filed Aug. 26, 2013, entitled "Bottom-Up Fill In Damascene Features".

US Notice of Allowance, dated Aug. 3, 2009, issued in U.S. Appl. No. 11/682,175.

US Office Action, dated Nov. 4, 2009, issued in U.S. Appl. No. 11/682,175.

US Notice of Allowance, dated May 17, 2010, issued in U.S. Appl. No. 11/682,175.

US Office Action, dated Feb. 19, 2009, issued in U.S. Appl. No. 12/075,023.

US Office Action, dated Sep. 15, 2009, issued in U.S. Appl. No. 12/075,023.

(56) References Cited

OTHER PUBLICATIONS

US Office Action, dated Mar. 5, 2010, issued in U.S. Appl. No. 12/075,023.
US Notice of Allowance, dated Feb. 18, 2011, issued in U.S. Appl. No. 12/075,023.
US Office Action, dated Jan. 26, 2012, issued in U.S. Appl. No. 12/785,205.
US Office Action, dated Jun. 29, 2012, issued in U.S. Appl. No. 12/785,205.
US Notice of Allowance, dated Dec. 26, 2012, issued in U.S. Appl. No. 12/785,205.
US Office Action, dated Feb. 15, 2013, issued in U.S. Appl. No. 13/108,894.
US Notice of Allowance, dated Jul. 5, 2013, issued in U.S. Appl. No. 13/108,894.
US Office Action (Reexam-Miscellaneous Action) dated Sep. 5, 2013, issued in U.S. Appl. No. 13/108,894.
US Office Action, dated May 23, 2013, issued in U.S. Appl. No. 13/108,881.
Chyan, Oliver et al. (2003) "Electrodeposition of Copper Thin Film on Ruthenium," *Journal of The Electochemical Society*, 150(5):C347-C350.
Fairweather, W. A. (1983) "The Throwing Power of Acid Copper Plating Processes for Printed Circuit Boards," *Imasa ltd.*, Slough, Berkshire MS, 4 pp.
Fang et al. (2004) "Uniform Copper Electroplating on Resistive Substrates," Abs. 167, 205$^{th}$ Meeting, *The Electrochemical Society*, Inc., 1 page.
Friedrich et al. (Aug. 1999) "A Simulation Study of Copper Reflow Characteristics in Vias", *IEEE Transactions on Semiconductor Manufacturing*, 12(3):353-363.
T.P. Hoar and J. N. Agar (1947) "Factors in Throwing Power Illustrated by Potential-Current Diagrams", pp. 162-168.
Takahashi, Ken M. (2000) "Electroplating Copper onto Resistive Barrier Films," *Journal of the Electrochemical Society*, 147(4):1414-1417.
Taylor & Francis Group, LLC. (2008) "Damascene Cu Electroplating Chemistry", *Handbook of Semiconductor Manufacturing Technology*, 16.3, 2 pp.
U.S. Appl. No. 14/256,671, filed Apr. 18, 2014, entitled "Method and Apparatus for Preparing a Substrate With a Semi-Noble Metal Layer."
US Notice of Allowance, dated Dec. 6, 2013, issued in U.S. Appl. No. 13/367,710.
US Final Office Action, dated Oct. 25, 2013, issued in U.S. Appl. No. 13/108,881.
US Office Action, dated Oct. 22, 2015, issued in U.S. Appl. No. 14/153,582.
US Office Action, dated Nov. 6, 2015, issued in U.S. Appl. No. 14/010,404.
Chinese First Office Action dated Sep. 25, 2015 issued in CN 201210109495.2.
Taiwan Office Action [no translation] dated Nov. 3, 2015 issued in TW 101113298.
Chinese First Office Action dated Jul. 20, 2015 issued in CN 201210108100.7.
US Office Action, dated Feb. 5, 2016, issued in U.S. Appl. No. 14/256,671.
Chinese Second Office Action [no translation] dated Feb. 25, 2016 issued in CN 201210108100.7.
Taiwan Office Action dated Jan. 20, 2016 issued in TW 101113319.
Taiwan Office Action dated Nov. 3, 2015 issued in TW 101113298 (with translation).
US Office Action, dated May 9, 2016, issued in U.S. Appl. No. 14/153,582.
US Final Office Action, dated May 20, 2016, issued in U.S. Appl. No. 14/010,404.
US Final Office Action, dated May 19, 2016, issued in U.S. Appl. No. 14/256,671.
US Office Action, dated Aug. 25, 2016, issued in U.S. Appl. No. 14/256,671.
Chinese Second Office Action dated Jul. 15, 2016 issued in CN 201210109495.2.
U.S. Office Action, dated Dec. 2, 2016, issued in U.S. Appl. No. 14/153,582.
Chinese Third Office Action dated Dec. 28, 2016 issued in CN 201210109495.2.
U.S. Office Action, dated Apr. 26, 2017, issued in U.S. Appl. No. 14/010,404.

\* cited by examiner

METHOD AND APPARATUS FOR FILLING INTERCONNECT STRUCTURES

CROSS-REFERENCE TO RELATED APPLICATIONS

This application is a divisional of U.S. patent application Ser. No. 13/108,894, filed May 16, 2011, which claims benefit under 35 U.S.C. § 119(e) to U.S. Provisional Patent Application No. 61/476,091, filed Apr. 15, 2011, all of which are herein incorporated by reference.

BACKGROUND

Damascene processing, a semiconductor processing technique, may be used to form interconnections on an integrated circuit. Damascene processing involves the formation of inlaid metal lines in trenches and vias formed in a dielectric layer. In a typical damascene process, a pattern of trenches and vias is etched in the dielectric layer of a semiconductor wafer substrate. A barrier layer, such as tantalum (Ta), tantalum nitride (TaN), or a TaN/Ta bi-layer, is then deposited onto the wafer surface by, for example, a physical vapor deposition (PVD) process. The trenches and vias are then typically filled with copper using an electroplating process. Because electroplating typically needs to occur on a conductive layer, a copper seed layer may be first deposited on the barrier layer with chemical vapor deposition (CVD) or PVD processes. Then, copper may be electroplated onto the copper seed layer.

SUMMARY

Methods, apparatus, and systems for plating copper and other metals are provided. According to various implementations, the methods involve plating a copper layer onto a wafer substrate. The copper layer may be annealed, which may redistribute copper from regions of the wafer substrate to features in the wafer substrate. In some cases, the plating and subsequent annealing serves as one cycle of a multicycle deposition process. Thus, the deposition process may involve two or more plating/annealing cycles performed serially.

In some implementations, a method includes providing a wafer substrate to an apparatus. The wafer substrate includes a surface with field regions and a feature. A copper layer is plated onto the surface of the wafer substrate. The copper layer is then annealed, with the annealing redistributing copper from regions of the wafer substrate to the feature.

In some implementations, the surface of the wafer further includes a liner layer over the field regions and the feature. The liner layer may be annealed in a reducing atmosphere prior to plating the copper layer, in some implementations. The liner layer may be selected from the group consisting of ruthenium (Ru), cobalt (Co), tungsten (W), osmium (Os), platinum (Pt), palladium (Pd), gold (Au), and rhodium (Rh).

In some implementations, a method includes providing a wafer substrate to an apparatus. The wafer substrate includes a surface covered with a liner layer, with the surface including field regions and a feature. A copper layer is plated onto the surface of the wafer substrate with an electroplating process. The copper layer is then annealed, with the annealing redistributing copper from regions of the wafer substrate to the feature. The annealing may be performed in a reducing atmosphere at a temperature of about 150 to 400° C. for a duration of about 30 to 180 seconds.

In some implementations, an apparatus includes a plating chamber, a wafer substrate holder, an element, and a controller. The plating chamber is configured to hold an electrolyte. The wafer substrate holder is configured to hold a wafer substrate in the plating chamber. The wafer substrate includes a surface having edge regions, field regions, and a feature.

The element includes an ionically resistive body with perforations in the body such that the perforations do not form communicating channels within the body. The perforations allow for transport of the electrolyte through the element. The element is positioned to have a surface facing the surface of the wafer substrate, with the surface of the element being located within about 10 millimeters from the surface of the wafer substrate when the wafer substrate is held by the wafer substrate holder. Substantially all the perforations in the ionically resistive body have a principal dimension of an opening on the surface of the element facing the surface of the wafer substrate of no greater than about 5 millimeters. The porosity of the element is about 1 to 3%.

The controller includes program instructions for conducting a process. The process includes plating a copper layer onto the surface of the wafer substrate using the plating chamber and annealing the copper layer. Annealing the copper layer redistributes copper from regions of the wafer substrate to the feature.

In some implementations, a non-transitory computer machine-readable medium includes program instructions for control of an apparatus. The program instructions include code for operations including transporting a wafer substrate to modules associated with the apparatus, plating a copper layer onto the surface of the wafer substrate, and annealing the copper layer. The wafer substrate includes a surface with field regions and a feature. Annealing the copper layer redistributes copper from regions of the wafer substrate to the feature.

These and other aspects of implementations of the subject matter described in this specification are set forth in the accompanying drawings and the description below.

DETAILED DESCRIPTION

Introduction

Figure 1:
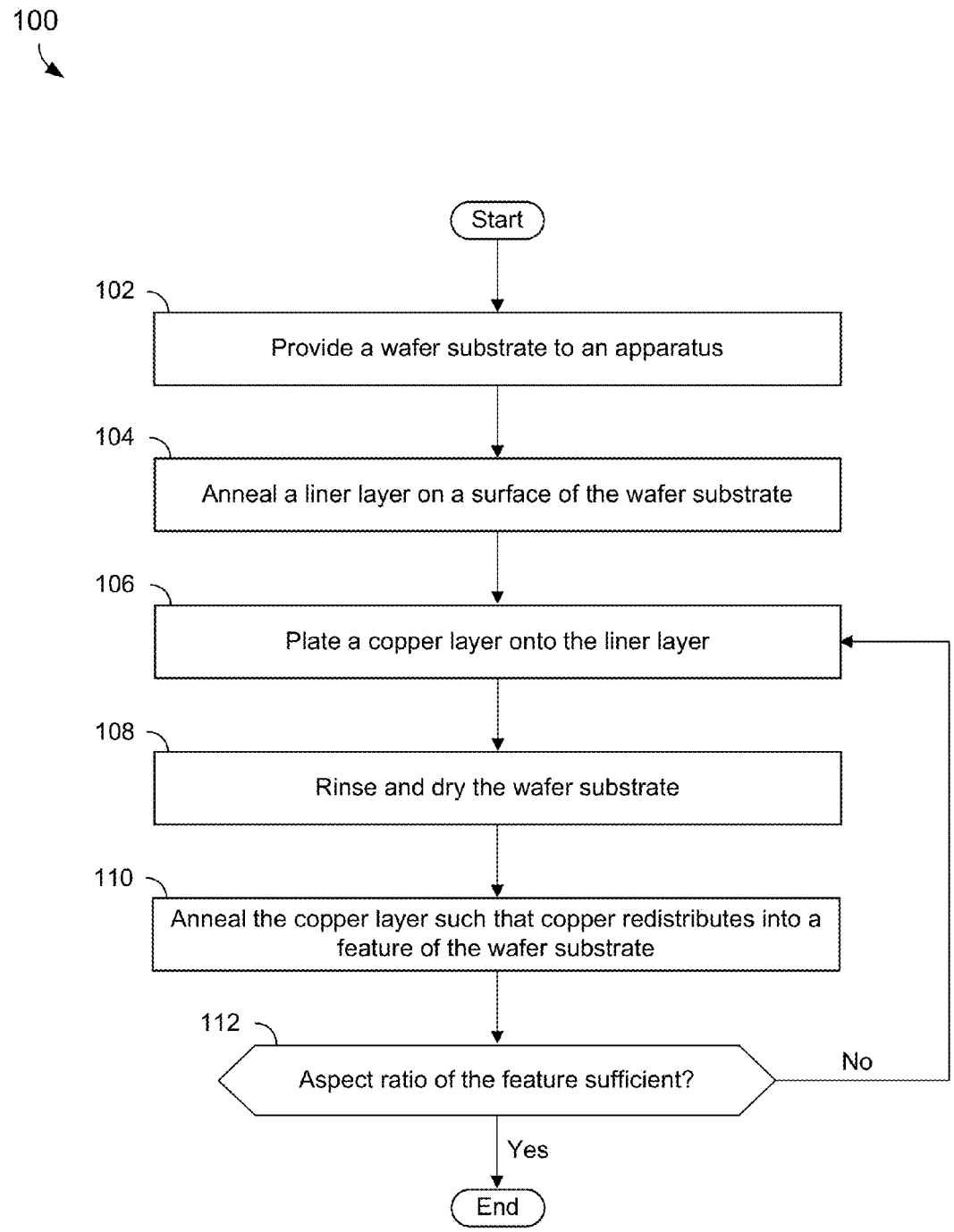
FIG. 1 shows an example of a flow diagram illustrating a process for plating copper.

In the following detailed description, numerous specific implementations are set forth in order to provide a thorough understanding of the invention. However, as will be apparent to those of ordinary skill in the art, the present invention may be practiced without these specific details or by using alternate elements or processes. In other instances well-known processes, procedures, and components have not been described in detail so as not to unnecessarily obscure aspects of the present invention.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. The work piece on which the disclosed operations may be performed may be of various shapes, sizes, and materials. In addition to semiconductor wafers, other work pieces that may take advantage of this invention include various articles such as printed circuit boards and the like.

Current technology for the metallization of integrated circuits includes depositing barrier and liner layers via physical vapor deposition (PVD) processes, seeding the liner layer with copper (Cu) deposited via a PVD process, and then electroplating copper using a process which provides void-free bottom-up fill. Electroplating technology, however, is not easily extended to feature sizes below about 18 nanometers. At these dimensions, the opening of a small feature may decrease to about 2 to 4 nanometers due to a coating of a barrier layer and a liner layer, for example, prior to an electroplating process. This makes the feature a very high aspect ratio feature which may not allow for bottom-up fill without voids with some electroplating processes.

Implementations disclosed herein may overcome the difficulty of filling very small features by the sequential plating of copper layers and the redistribution of copper to fill the features. Such features may be below about 100 nanometers in size and have a high aspect ratio. Implementations of methods and apparatus to fill small integrated circuit features that may be coated with barrier/liner layers are disclosed herein. In some implementations, the process operations may fully fill the features with copper. Further, some disclosed implementations do not use a copper seed layer deposited with a physical vapor deposition (PVD) process.

In some implementations, a layer of copper is plated directly onto a liner layer of a wafer substrate. The liner layer may be, for example, a layer of ruthenium or other suitable conductive barrier metal. The plated copper layer may then be then annealed. In some implementations, the anneal may be at about 150 to 400° C. for about 30 to 180 seconds in a reducing atmosphere, such as forming gas. The anneal may redistribute the copper of the copper layer into small features. The anneal also may maintain the copper layer and any subsequently exposed regions of the liner layer in a reduced state. The copper plating and anneal processes may be repeated about 2 to 8 times so that small features, such as features from about 8 to 100 nanometers in width or diameter, are filled gradually and without voids. In some implementations, the thickness of each plated copper layer may be about 2 to 20 nanometers, depending on the feature size and aspect ratio. The wafer substrate may then be plated using a conventional electroplating process to fill larger features prior to chemical-mechanical planarization (CMP).

In some implementations, a resistive element is used in an electroplating apparatus to aid in mitigating or eliminating the "terminal effect" when plating a copper layer. The terminal effect may increase the plated thickness near a wafer edge for a wafer surface having a sheet resistance greater than about 1 ohm/square, which is undesirable. In some implementations, the resistive element includes a number of isolated and unconnected through-holes in close proximity to the wafer, thereby dominating the overall resistance of the electroplating apparatus.

Method

FIG. 1 shows an example of a flow diagram illustrating a process for plating copper. At block 102 of the method 100, a wafer substrate is provided. The wafer substrate may include a feature and field regions. The feature may be of varying widths or diameters and aspect ratios. The aspect ratio of a feature is the ratio of the height of the vertical side wall of the feature to the width of the feature.

For example, the width or diameter of the feature may be about 100 nanometers, about 90 nanometers, about 60 nanometers, about 30 nanometers, about 18 nanometers, about 15 nanometers, about 12 nanometers, about 8 nanometers, less than about 100 nanometers, or less than about 18 nanometers. For features with larger widths other processes for depositing copper may be faster and more efficient than implementations of the method 100. The method 100, however, may be used to fill a portion or a part of such a larger width feature with copper.

In some implementations, the wafer substrate may be a wafer substrate that has undergone damascene processing, and the feature in the wafer substrate may be a line feature or a via feature etched in a dielectric layer. The aspect ratio of the feature etched in the dielectric layer may be about 10:1 or greater, for example. In some implementations, the dielectric layer may be covered with a barrier layer and the barrier layer may be covered with a liner layer. In other implementations, the barrier and liner may be a single layer of one material. That is, a liner layer may exhibit barrier layer properties such that a separate barrier layer and liner layer are not needed. The aspect ratio of the feature etched in the dielectric layer covered with a barrier/liner layer may be about 12:1, about 15:1, or greater than about 12:1, for example. In other implementations, the feature may be a contact via having an aspect ratio of about 15:1, about 20:1, or greater than about 15:1.

For example, the dielectric layer may be covered with a tantalum nitride (TaN) barrier layer. The TaN barrier layer may be about 2 nanometers thick. The TaN barrier layer may be deposited with a physical vapor deposition (PVD) process or a chemical vapor deposition (CVD) process. In other implementations, the barrier layer may be tantalum (Ta), tungsten (W), tungsten nitride (WN), titanium (Ti), or titanium nitride (TiN), for example. The barrier layer may be covered with a ruthenium (Ru) liner layer. The Ru liner layer may be about 2 nanometers thick. The Ru liner layer may be deposited with a CVD process. In other implementations, the liner layer may be cobalt (Co), tungsten (W), osmium (Os), platinum (Pt), palladium (Pd), gold (Au), or rhodium (Rh), for example.

In some implementations, the liner layer is selected so that copper wets the liner layer. Wetting is the ability of a liquid to maintain contact with a solid surface. A liquid that wets a solid surface spreads across the surface. A liquid that does not wet a solid surface forms a droplet or sphere on the surface to minimize contact with the surface. The degree of wetting of a liquid in contact with a solid surface is determined by adhesive forces (i.e., forces between the liquid and the solid) and cohesive forces (i.e., forces within the liquid). For example, based on the oxidation behavior of the metals, metals that copper wets include Ru, Pt, Pd, Au, and Rh.

At block 104, the liner layer on the surface of the substrate is annealed. In some implementations, the liner layer may be annealed in a reducing atmosphere to remove contaminants or to reduce any native oxides to a metal. Contaminants may include carbon adsorbed to the surface of the liner layer, for example. Removing contaminants or reducing native oxides may aid in the formation of a continuous layer of copper in the plating process, described below.

In some implementations, the reducing atmosphere includes a forming gas, atomic hydrogen, or other chemical reducing agents. Forming gas is a mixture of hydrogen (the hydrogen mole fraction is variable) and nitrogen. In some implementations, the liner layer may be annealed at about 150 to 400° C. for about 30 to 180 seconds. For example, the liner layer may be annealed at about 225° C. in a forming gas for about 90 seconds. In other implementations, the liner layer may be treated under other reducing conditions, such as a hydrogen plasma or atomic hydrogen.

At block 106, a copper layer is plated on the liner layer. In some implementations, the copper layer is plated with an electroplating process, and in other implementations, the copper layer is plated with an electroless plating process. In some implementations, the plating process in block 106 may be performed at about room temperature (i.e., about 20 to 29° C., or about 25° C.).

In some implementations, the thickness of the plated copper layer may be about 20 to 80% of the width or diameter of a feature on the wafer substrate. For example, the copper layer may be about 2 to 20 nanometers thick or about 2 to 10 nanometers thick. In some implementations, the copper layer has a thickness such that there is enough copper to fill about 10 to 50% of the feature with each annealing operation at block 110, described below. In some implementations, the copper layer may form an approximately conformal layer on the liner layer both in the feature and on the field regions of the wafer substrate.

In some implementations, the copper layer as plated may be a continuous copper layer. That is, the copper layer may form a continuous layer over the liner layer. In other implementations, the copper may be discontinuous. That is, regions of the liner layer may not be covered with the copper layer. For example, the copper layer may cover the liner layer except for a region of the liner layer over a portion of a field region of the wafer substrate.

In some implementations, the copper layer may exhibit some preferential growth within a feature, and in other implementations, the copper layer may exhibit slightly slower growth within a feature.

In some implementations, the copper layer may include an alloying element; i.e., a copper alloy layer may be plated on the liner layer. The alloying element may have an atomic mass of about 50 to 210. For example, the alloying element may be chromium, iron, cobalt, nickel, zinc, ruthenium, rhodium, palladium, silver, indium, tin, tellurium, platinum, gold, or lead. One or more of these alloying elements may be included in the copper layer. In some implementations, the copper layer includes about 0.1 to 5 weight percent of an alloying element or elements. As explained below, the alloying element may provide some protection against damage resulting from electromigration.

As noted above, in some implementations, the copper layer may be plated with an electroplating process. In some implementations, the electroplating solution and hardware may allow for uniform across-wafer deposition of copper. For example, the electroplating solution may be a dilute highly complexed copper electroplating solution. With such electroplating solutions, copper nucleation may be uniform and continuous on a resistive wafer substrate. Dilute highly complexed copper electroplating solutions are further described in U.S. Pat. No. 7,799,684, which is herein incorporated by reference. The electroplating solutions may also include additives, such as polymers, that may enhance the plating rate in smaller features to aid in filling these features.

Other methods of depositing copper with electroplating processes are described in U.S. patent application Ser. No. 12/075,023, titled "TWO STEP COPPER ELECTROPLATING PROCESS WITH ANNEAL FOR UNIFORM ACROSS WAFER DEPOSITION AND VOID FREE FILLING ON RUTHENIUM COATED WAFERS," and filed Mar. 6, 2008, and U.S. patent application Ser. No. 12/785,205, titled "COPPER ELECTROPLATING PROCESS FOR UNIFORM ACROSS WAFER DEPOSITION AND VOID FREE FILLING ON SEMI-NOBLE METAL COATED WAFERS," and filed May 21, 2010, both of which are herein incorporated by reference. Apparatus for electroplating copper are further described below.

As noted above, in some implementations, the copper may be plated with an electroless plating process. Electroless plating, also known as chemical or auto-catalytic plating, may be performed without the use of external electrical power, in some cases. With electroless plating processes, the terminal effect that is sometimes present in electroplating processes does not exist because current is not delivered to the wafer substrate from an external source. Copper layer uniformity is more easily achieved with electroless plating processes, in some implementations. Electroless plating processes and apparatus are further described in U.S. Pat. Nos. 6,664,122, 6,815,349, 7,456,102, 7,897,198, all of which are herein incorporated by reference.

At block 108, the wafer substrate is rinsed and dried. In some implementations, the wafer substrate may be rinsed and dried in a spin rinse dryer (SRD). Processes and apparatus for rinsing and drying wafer substrates are further described in U.S. Pat. No. 7,033,465, which is herein incorporated by reference.

At block 110, the copper layer is annealed such that copper redistributes from regions of the wafer substrate to the feature. The regions of a wafer substrate may include field regions. In some implementations, the copper redistributes from field regions of the wafer substrate to the feature. In some implementations, the copper redistributes from regions of the wafer substrate to the bottom of the feature. In some implementations, the copper layer is annealed at about 150 to 400° C. for about 30 to 180 seconds. In some implementations, the anneal may be performed under a reducing atmosphere. The reducing atmosphere may be any reducing atmosphere which maintains the liner layer in an oxide-free state and prevents oxidation of copper. For example, in some implementations, the reducing atmosphere includes forming gas, atomic hydrogen, or other chemical reducing agents.

Heating the copper layer to anneal it may be accomplished with many different techniques. For example, the copper layer may be heated by passing electric current through the copper layer (i.e., resistive heating). The copper layer may also be heated with ultraviolet (UV) light or infrared (IR) light. In some implementations, the wafer substrate may be heated constantly or periodically during the process cycles.

In some implementations, annealing the copper layer causes copper plated in a feature to redistribute to the base of the feature. For example, copper plated onto the sides of the feature may redistribute to the bottom of the feature. In some cases, plated copper is drawn into the feature from the field regions of the wafer substrate.

While not wanting to be bound by any theory, it is believed that the redistribution of copper to a feature and to the base of a feature is the result of capillary effects. For example, if the feature is sufficiently small, the surface tension of the copper (which is caused by the cohesive forces within the copper) and the adhesive forces between the copper and the liner layer in the feature may act to draw copper into the base of the feature.

At block 112, it is determined whether the aspect ratio of the feature is sufficient. If the aspect ratio of the feature is sufficient, the method 100 ends. If the aspect ratio of the feature is not sufficient, operations 106 through 110 are repeated until the aspect ratio is sufficient. In some implementations, operations 106 through 110 are repeated about 2 to 8 times. In some implementations, the thickness of copper layer plated and the anneal temperature and duration may change for a process sequence of operations 106 through 110, but generally a plated copper layer is about 2 to 20 nanometers thick and the anneal temperature is about 150 to 400° C. for about 30 to 180 seconds.

A sufficient aspect ratio of the feature may be an aspect ratio for which bulk-layer electroplating processes may be performed without any void formation in the feature. For example, a sufficient aspect ratio of a feature may be about 2:1 or less, about 2:1, or about 1:1. If bulk-layer electroplating processes are performed with a wafer substrate having a high aspect ratio feature before performing an implementation of the method 100, copper metal may be plated onto the wafer substrate such that the opening of the feature is plugged with copper with a void beneath the plug.

After a feature in the wafer substrate is filled with copper to a sufficient aspect ratio, the wafer substrate may be plated with a bulk-layer of copper using a bulk electroplating process. In some implementations, the bulk-layer of copper may have a thickness of about 0.2 to 0.5 micrometers. Plating a bulk-layer of copper onto the wafer substrate with a bulk electroplating processes may improve the plated film topography prior to chemical-mechanical planarization (CMP). Subsequent processing of the wafer substrate after CMP follows standard damascene process flows, as known by one having ordinary skill in the art.

Thus, implementations of the method 100 serve to fill features with copper, ensuring bottom-up fill of the features so that no voids are formed. Operations 106 through 110 of the method 100 may be repeated until a feature is filled, in some implementations. Alternatively, operations 106 through 110 of the method 100 may be repeated until a feature is filled with copper to a level such that bulk electroplating processes may be performed without forming a void.

The number of repetitions of the process operations in blocks 106 through 110 to attain a desired level of copper in a feature is minimized, in some implementations. For example, it may be possible to attain a desired level of copper in a feature with 2 or 3 repetitions of the process operations in blocks 106 through 110. The number of repetitions of the process operations may be minimized, for example, by plating a layer of copper with an optimized thickness in block 106. The copper layer should not be too thick, because if the copper layer is too thick the feature opening may become plugged with copper in the plating process. The thicker the plated copper layer, however, the more copper there is on regions of the wafer substrate (including field regions) to redistribute to the feature during the anneal in block 110. Thus, plating a thick layer of copper is useful in providing copper able to redistribute to a feature, but the copper layer should not be so thick that it plugs the feature.

For example, a wafer substrate may include 20 nanometer features. In block 106, an about 5 nanometer thick layer of copper may be plated, followed by the rinse and dry in block 108 and the anneal in block 110. The features may be filled with copper to an adequate level with 2 or 3 repetitions of operations 106 through 110.

In some implementations, the plating process in block 106 may be performed at an elevated temperature. For example, an electroplating process may be performed at a temperature over the boiling point of water using an electroplating solution employing a higher boiling point solvent. As another example, an electroless plating process may be performed at a temperature of about 50 to 90° C. Performing the plating process at an elevated temperature may redistribute copper, at least partially, to a feature during the plating process, in some implementations.

Figure 2A:
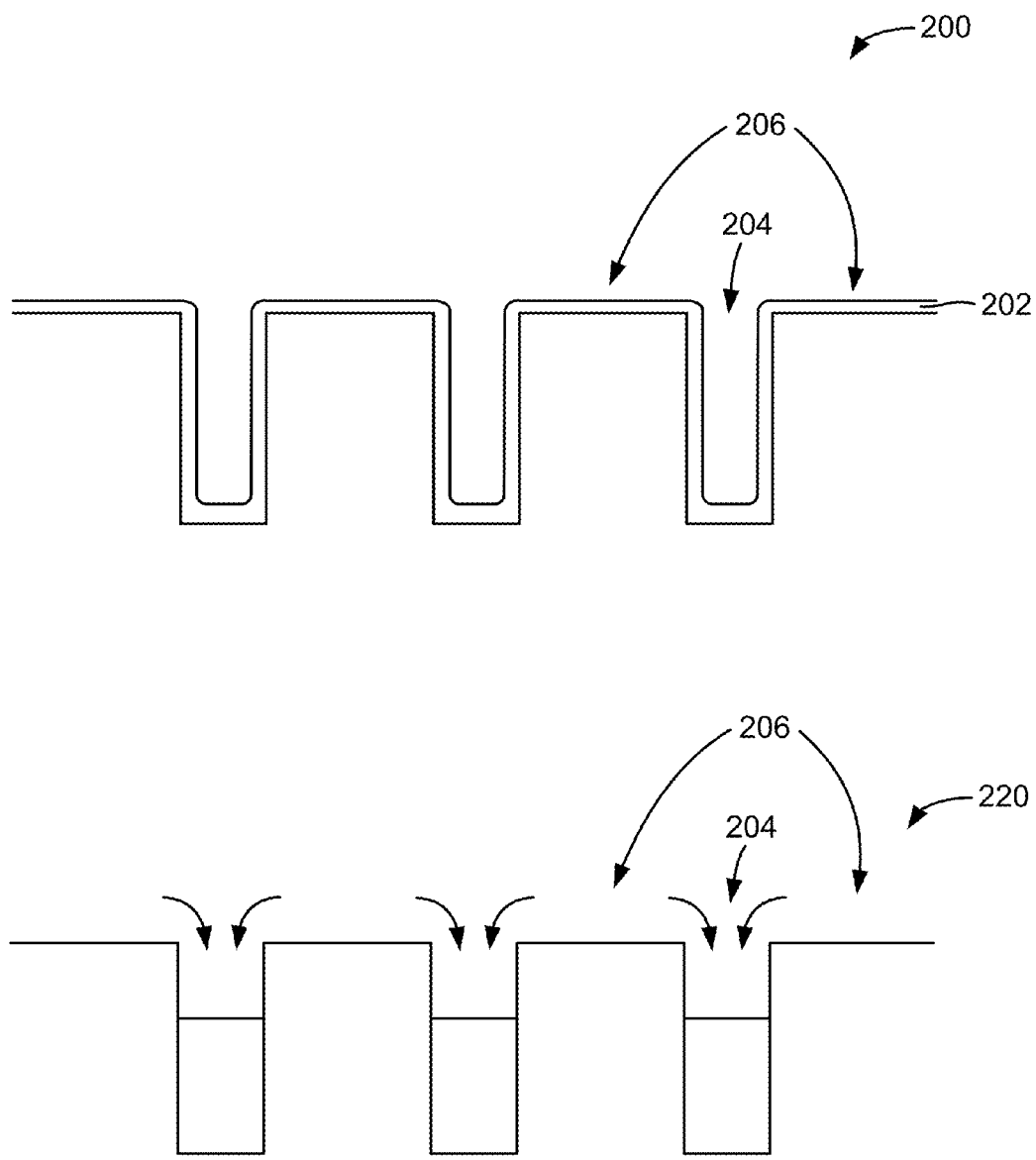
FIGS. 2A and 2B show examples of cross-sectional schematic illustrations of stages in a method of plating copper.
Figure 2B:
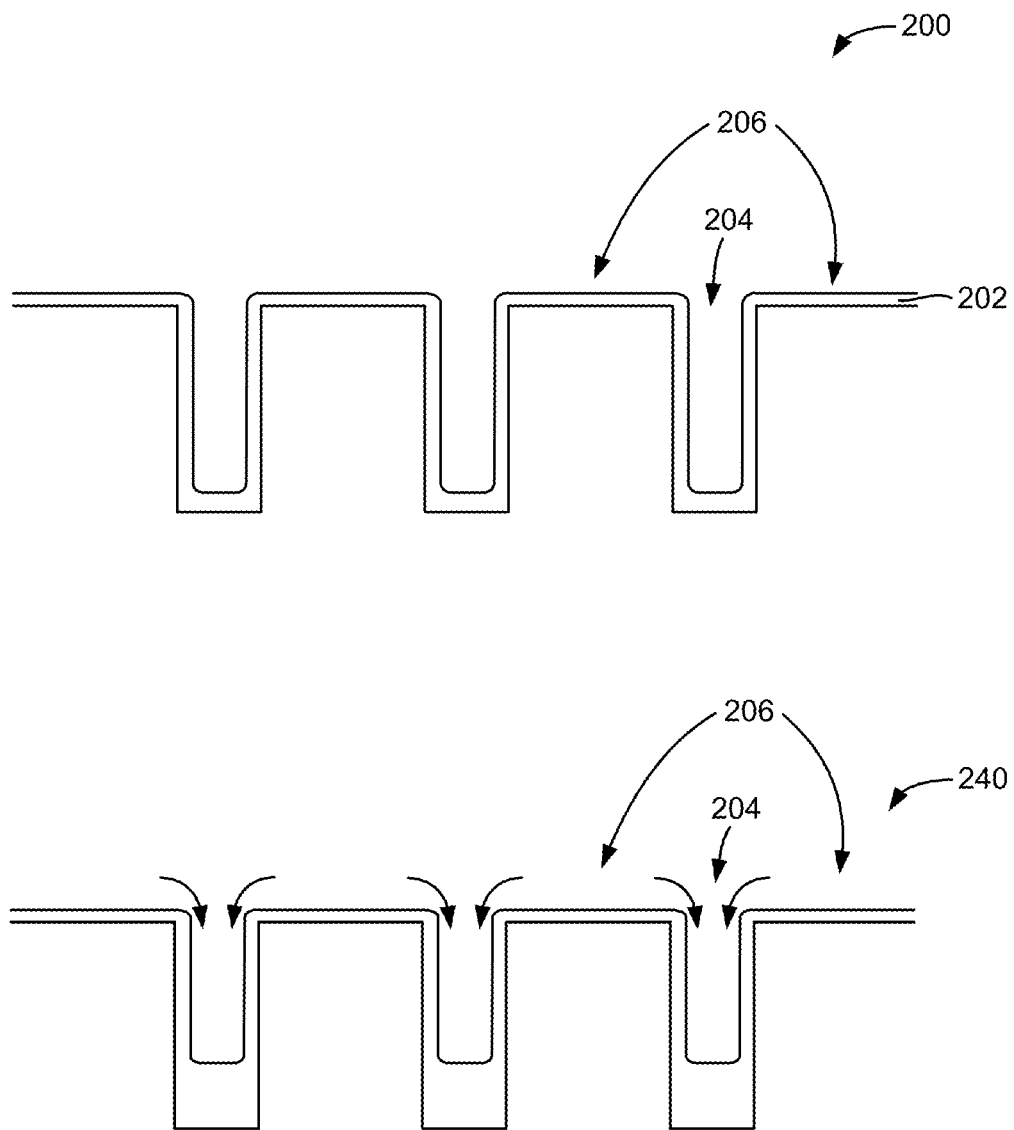

FIGS. 2A and 2B show examples of cross-sectional schematic illustrations of stages in a method of plating copper. In FIG. 2A, 200 illustrates a wafer substrate having features 204 and field regions 206. A copper layer 202 has been plated onto the wafer substrate, as in block 106 in FIG. 1. 220 illustrates the wafer substrate after an annealing process, as in block 110 of FIG. 1. As shown in 220, the copper layer 202 is redistributed to the bottom of the features 204, with no copper remaining in the field regions 206.

In FIG. 2B, similar to FIG. 2A, 200 illustrates a wafer substrate having features 204 and field regions 206. A copper layer 202 has been plated onto the wafer substrate, as in block 106 in FIG. 1. 240 illustrates the wafer substrate after an annealing process, as in block 110 of FIG. 1. As shown in 240, the copper layer 202 is redistributed to the bottom of the features 204, with some copper remaining in the field regions 206 and on the sidewalls of the features 204. Differences in the amount of copper redistribution, including whether copper remains in the field regions, may be due to, for example, the anneal time, the anneal temperature, or to different wafer substrate materials onto which the copper was deposited.

Figure 3:
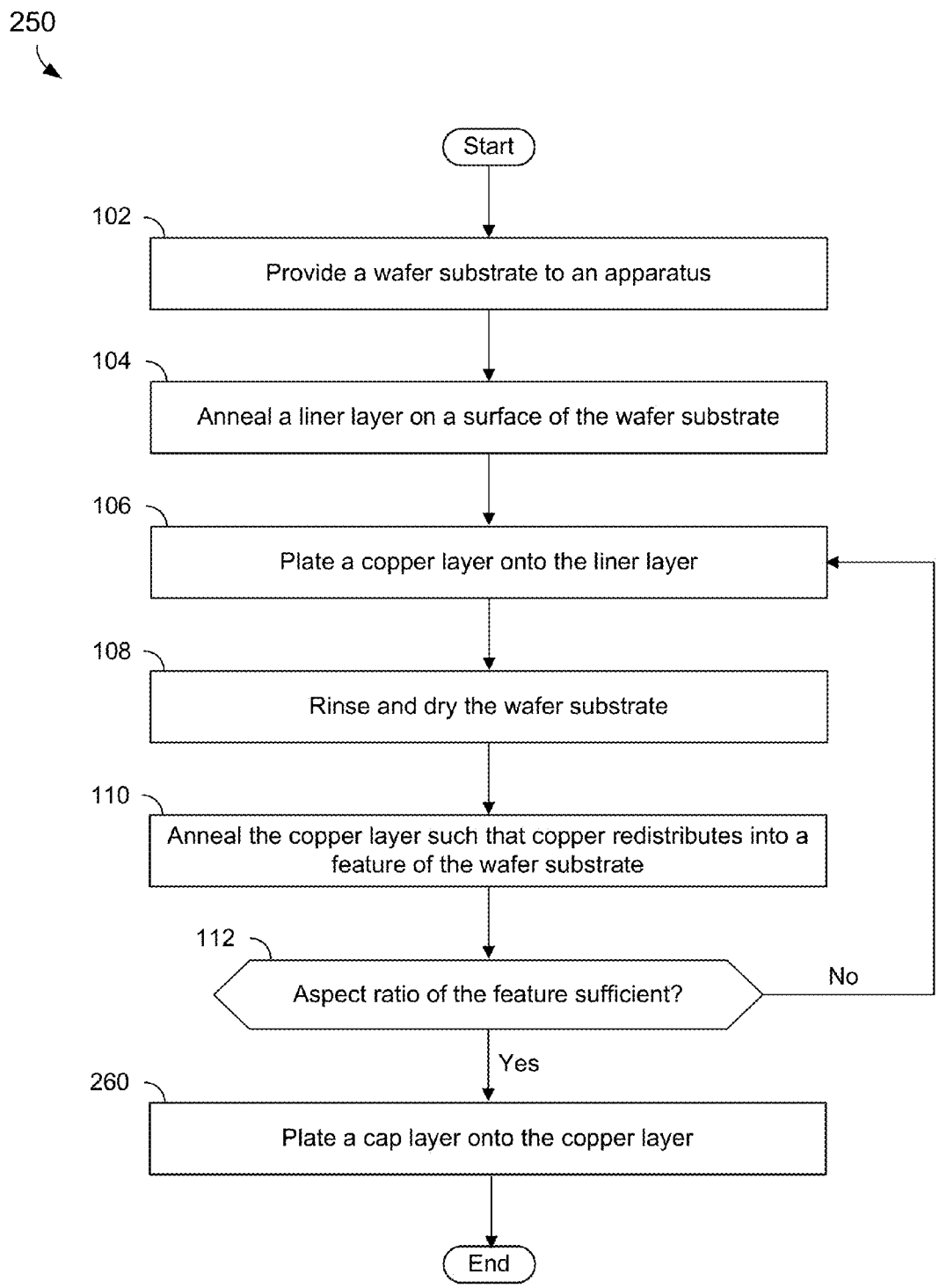
FIG. 3 shows an example of a flow diagram illustrating a process for plating copper.

FIG. 3 shows an example of a flow diagram illustrating a process for plating copper. The method 250 shown in FIG. 3 is similar to the method 100 shown in FIG. 1, with the addition of plating a cap layer in the method 250.

At block 260 in the method 250, after it is determined whether the aspect ratio of the feature is sufficient, a cap layer is plated onto the copper layer. The cap layer may include a copper layer with an alloying element (i.e., a copper alloy layer), for example. The copper alloying element may include any of the alloying elements noted above. The copper alloying element may aid in decreasing the electromigration of copper, which increases the electromigration life of the semiconductor device. The cap layer may also include metals other than copper that aid in decreasing the electromigration of copper.

In some implementations, the composition of the copper layers may be varied with each plating operation in block 106. For example, in a first plating operation, a substantially pure copper layer may be plated. In a second plating operation, a copper layer including about 2.5 weight percent of an alloying element may be plated. In a third plating operation, a copper layer including about 5 weight percent of the alloying element may be plated. Thus, the composition of the copper layer may be gradually increased to the composition of the cap layer.

In implementations of the method 100 in which copper layers with alloying elements are plated on the wafer substrate throughout the method 100, after a bulk-layer of copper is plated onto the wafer substrate using a bulk electroplating process, the wafer substrate may be treated to cause at least some of the alloying element to diffuse into the bulk-layer. In some implementations, the treatment may be a heat treatment. The copper alloying element diffusing into the bulk-layer also may aid in decreasing the electromigration of copper, increasing the electromigration life of the semiconductor device.

While the above methods are described with respect to copper plating and redistribution, the methods also may be applicable to the plating and redistribution of other metals, including tin (Sn), silver (Ag), and gold (Au), for example.

Apparatus

Implementations of suitable apparatus configured to accomplish the methods described herein include hardware for accomplishing the process operations and a system controller having instructions for controlling the process operations. An apparatus configured to allow efficient cycling of wafer substrates through sequential plating, rinsing, drying, and annealing process operations is useful for implementations for use in a manufacturing environment. The apparatus may include tools and/or chambers configured to perform more than one process operation. For example, the apparatus may include a plating chamber that is also configured to rinse and dry a wafer substrate and an annealing chamber. As another example, the apparatus may include a plating chamber and a chamber configured to rinse, dry, and anneal the wafer substrate. A specific implementation of a tool configured to rinse, dry, and anneal a wafer substrate could be a spin rinse dryer (SRD) combined with an annealing station.

Figure 4A:
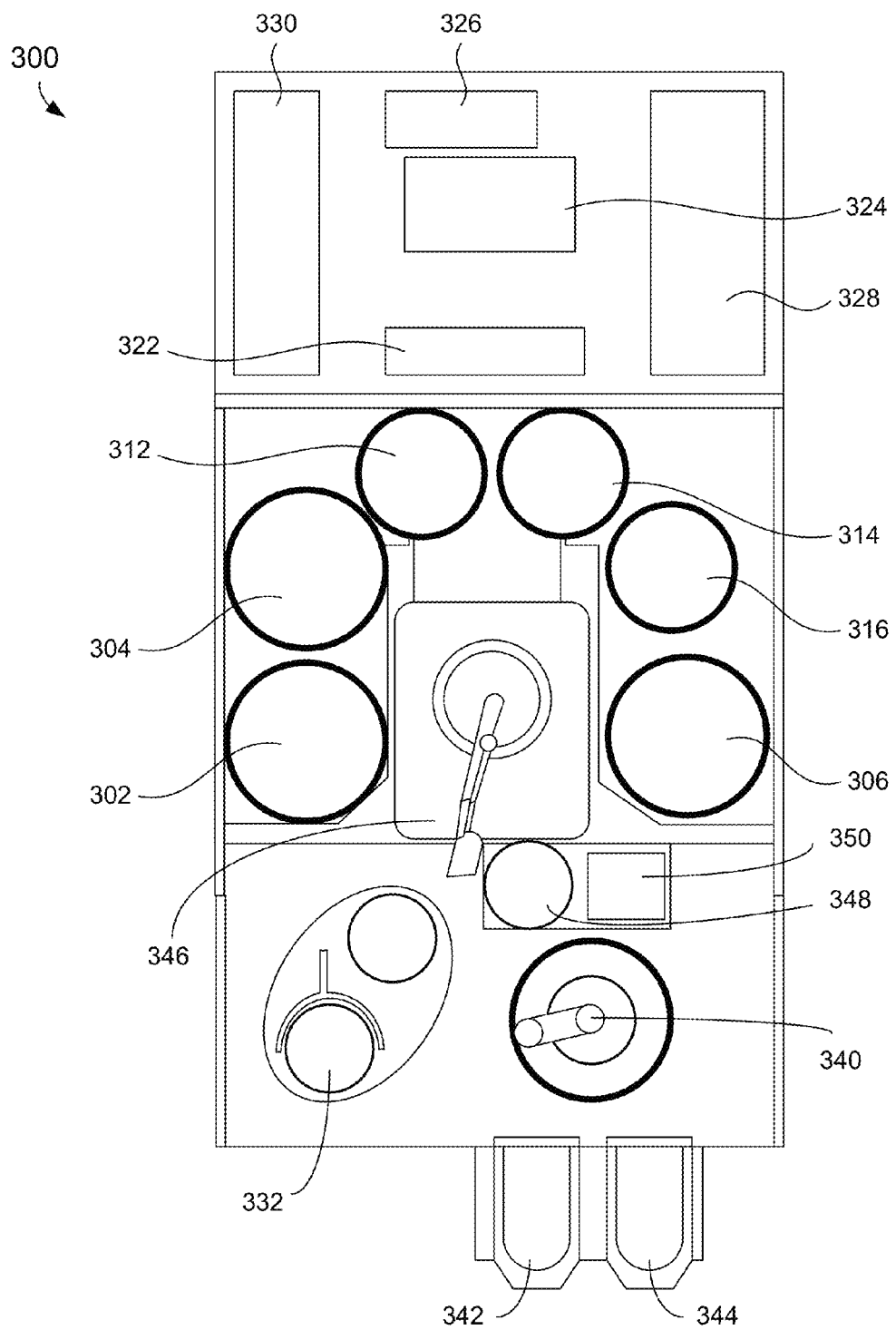
FIGS. 4A-4G show examples of schematic diagrams of electrofill systems.

FIGS. 4A-4G show examples of schematic diagrams of electrofill systems. FIG. 4A shows an example of a schematic diagram of an electrofill system 300. The electrofill system 300 includes three separate electrofill modules 302, 304, and 306. The electrofill system 300 also includes three separate modules 312, 314, and 316 configured for various process operations. For example, in some implementations, modules 312 and 316 may be SRDs and module 314 may be an anneal station. In other implementations, the modules 312, 314, and 316 may be post electrofill modules (PEMs) each configured to perform a function, such as edge bevel removal, backside etching, and acid cleaning of wafers after they have been processed by one of the electrofill modules 302, 304, and 306.

The electrofill system 300 includes a central electrofill chamber 324. The central electrofill chamber 324 is a chamber that holds the chemical solution used as the electroplating solution in the electrofill modules. The electrofill system 300 also includes a dosing system 326 that may store and deliver chemical additives for the electroplating solution. A chemical dilution module 322 may store and mix chemicals to be used as an etchant, for example, in a PEM. A filtration and pumping unit 328 may filter the electroplating solution for the central electrofill chamber 324 and pump it to the electrofill modules.

An annealing station 332 may be used to anneal wafers as a pretreatment. The annealing station 332 may also be used for annealing wafers for copper redistribution, as described above. The annealing station 332 may include a number of stacked annealing devices, e.g., five stacked annealing devices. The annealing devices may be arranged in the annealing station 332 one on top of another, in separate stacks, or in other multiple device configurations.

A system controller 330 provides the electronic and interface controls required to operate the electrofill system 300. The system controller typically includes one or more memory devices and one or more processors configured to execute instructions so that the apparatus can perform a method in accordance with the implementations described herein. Machine-readable media containing instructions for controlling process operations in accordance with the implementations described herein may be coupled to the system controller. The system controller 330 may also include a power supply for the electrofill system 300.

A hand-off tool 340 may select a wafer from a wafer cassette such as the cassette 342 or the cassette 344. The cassettes 342 or 344 may be front opening unified pods (FOUPs). A FOUP is an enclosure designed to hold wafers securely and safely in a controlled environment and to allow the wafers to be removed for processing or measurement by tools equipped with appropriate load ports and robotic handling systems. The hand-off tool 340 may hold the wafer using a vacuum attachment or some other attaching mechanism.

The hand-off tool 340 may interface with the annealing station 332, the cassettes 342 or 344, a transfer station 350, or an aligner 348. From the transfer station 350, a hand-off tool 346 may gain access to the wafer. The transfer station may be a slot or a position from and to which hand-off tools 340 and 346 may pass wafers without going through the aligner 348. In some implementations, however, to ensure that a wafer is properly aligned on the hand-off tool 346 for precision delivery to an electrofill module, the hand-off tool 346 may align the wafer with an aligner 348. The hand-off tool 346 may also deliver a wafer to one of the electrofill modules 302, 304, or 306 or to one of the three separate modules 312, 314, and 316 configured for various process operations.

An example of a process operation according to the methods described above may proceed as follows: (1) plate a layer of copper onto the wafer in the electrofill module 304; (2) rinse and dry the wafer in a SRI) in module 312; and, (3) anneal the wafer for copper redistribution in module 314. If further copper electroplating for copper redistribution is needed, the process operations could be repeated. After the copper layer and anneal processes are completed, a cap layer may be plated onto the wafer in the electrofill module 302. A bulk-layer of copper may be plated onto the wafer in the electrofill module 306. The electrofill modules 302, 304, and 306 could also be used interchangeably by providing the electrofill modules with an electroplating solution appropriate for the process to be performed. For example, the electrofill module 302 could be used for copper electroplating with one electroplating solution. The electroplating solution could be drained from the electrofill module 302 and replaced with an electroplating solution for bulk-layer copper electroplating in subsequent process operation.

In some implementations, the module 314 may anneal the wafer with a hot plate resistive electrical heating of the copper layer itself. In some implementations, the module 314 may include a ultraviolet (UV) light source or an infrared (IR) light source to anneal the wafer. In some implementations, the electrofill system 300 may include a device to heat the wafer constantly during plating operations. This might be done through the wafer backside.

As noted above, an apparatus configured to allow efficient cycling of wafer substrates through sequential plating, rinsing, drying, and annealing process operations is useful for implementations for use in a manufacturing environment. To accomplish this, the module 312 could be configured as a spin rinse dryer and an annealing chamber. With such a module 312, the wafer would only need to be transported between the electrofill module 304 and the module 312 for the copper plating and annealing operations. Further, in some implementations, the electrofill system 300 may keep the wafer substrate in a vacuum environment or an inert gas atmosphere to aid in avoiding contamination of the wafer.

FIGS. 4B-4G show examples of simplified schematic diagrams of alternative electrofill systems. Note that some or all of the features included in the electrofill system 300 shown in FIG. 4A may be included in the electrofill systems shown in FIGS. 4B-4G. For example, the electrofill systems shown in FIGS. 4B-4G may include post electrofill modules (PEMs) for edge bevel removal or other operations. FIGS. 4B-4G primarily show examples of some of the different configurations of modules that are possible.

Figure 4B:
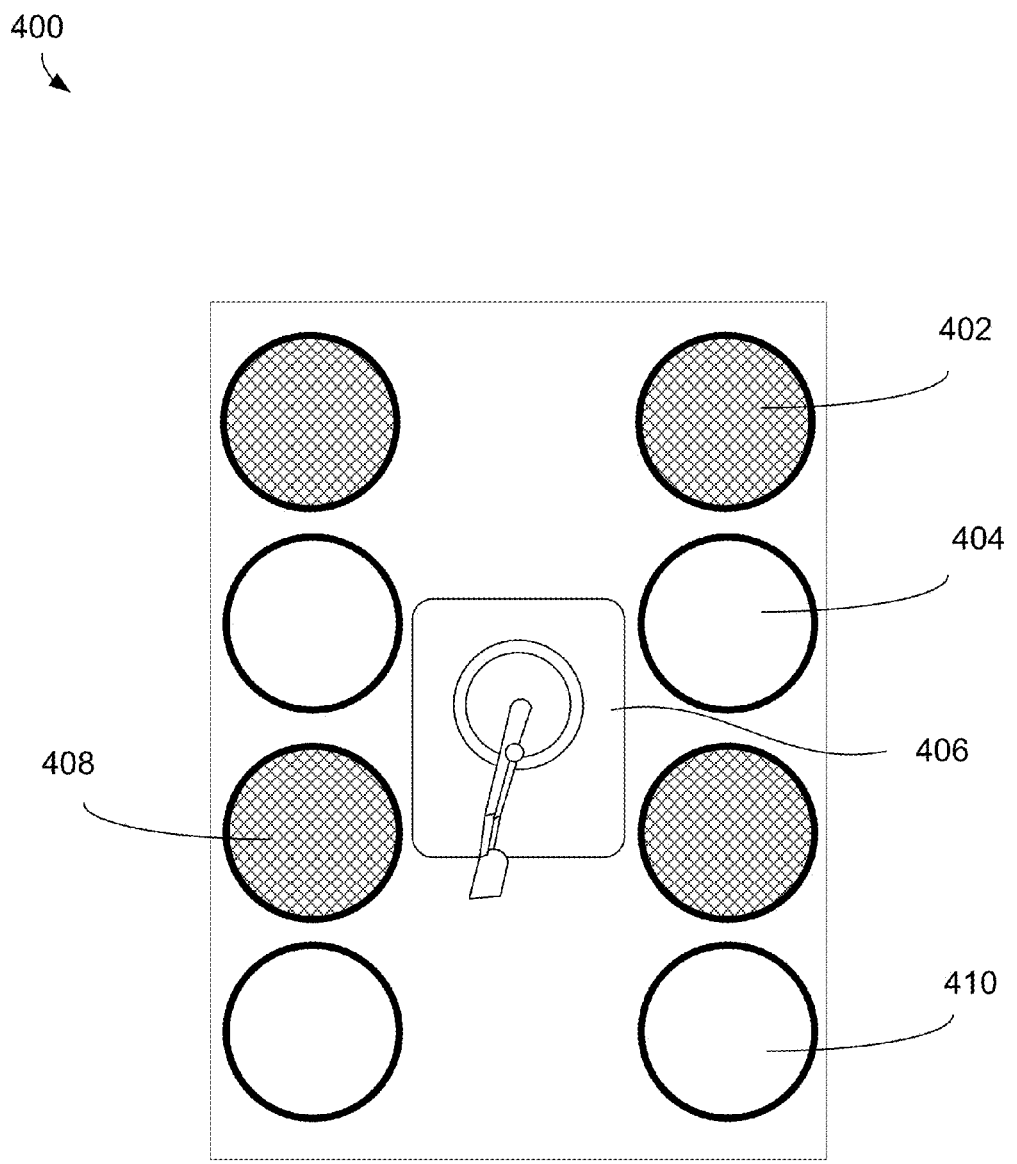

The electrofill system 400 shown in FIG. 4B includes four plate/rinse modules 402 and four dry/anneal modules 404. The electrofill system 400 also includes a hand-off tool 406 that may be similar to the hand-off tools 340 and 346, described above. The four plate/rinse modules may each include apparatus configured to plate the wafer and to rinse the wafer. The four dry/anneal modules may each include apparatus configured to dry the wafer and to anneal the wafer. In some implementations, the electrofill system 400 may include fewer modules (e.g., four modules or six modules) or more modules (e.g., ten modules or twelve modules). Further, in some implementations, each of the eight modules shown in the electrofill system 400 may include two, three, or more modules stacked on top of one another. For example, the plate/rinse module 408 may include three plate/rinse modules stacked on top of one another and the dry/anneal module 410 may include three dry/anneal modules stacked on top of one another.

The modules in the electrofill system 400 may include apparatus for different operations, as described herein. For example, the four plate/rinse modules 402 may instead be plate modules and the four dry/anneal modules may instead be rinse/dry/anneal modules. As another example, some modules may be rinse/dry modules. Rinse/dry modules, in some implementations, may include components configured to spin wafers rapidly.

Figure 4C:
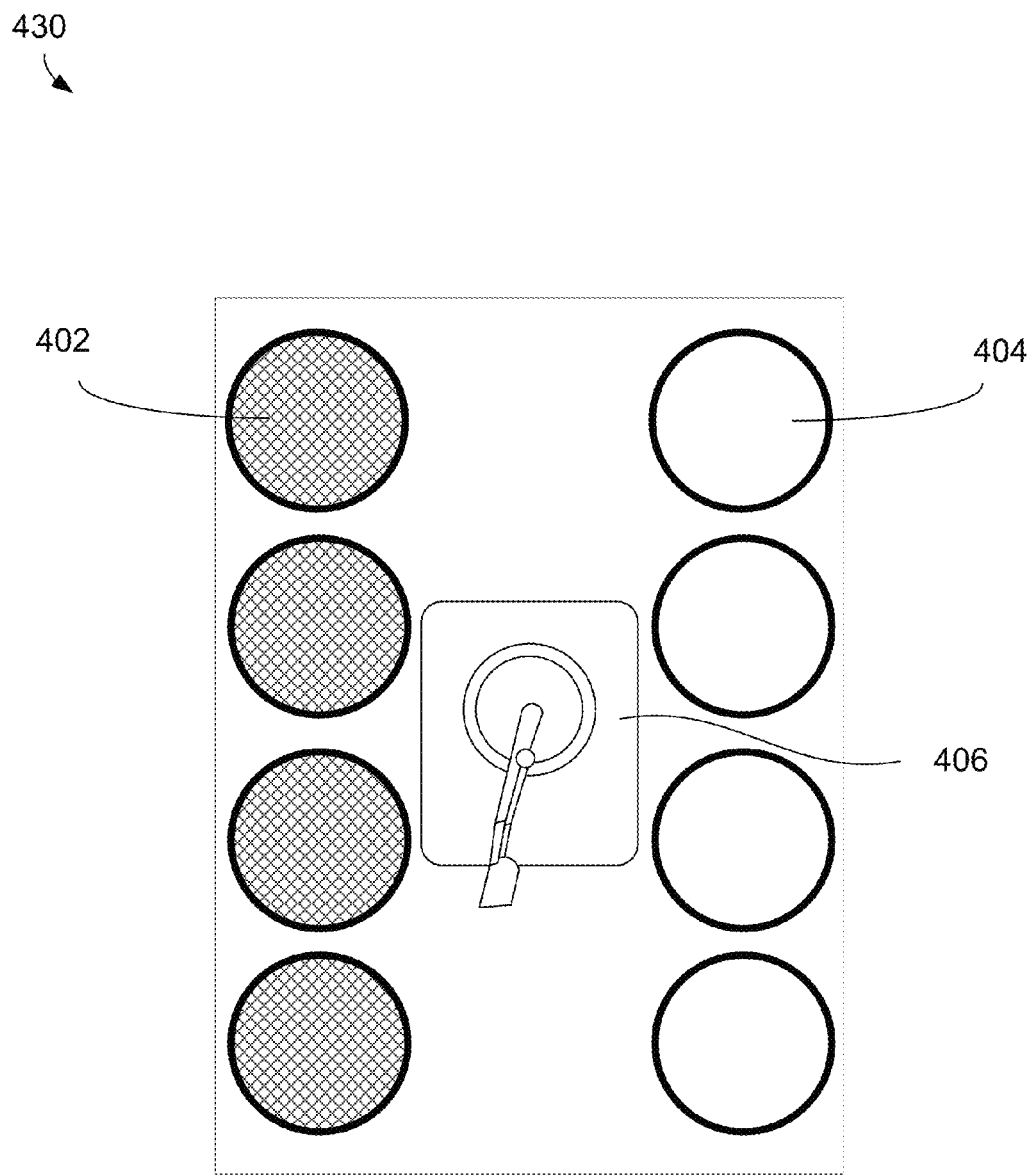

The electrofill system 430 shown in FIG. 4C includes four plate/rinse modules 402 and four dry/anneal modules 404. The electrofill system 430 also includes a hand-off tool 406. The electrofill system 430 is similar to the electrofill system 400, with one difference being that all of the plate/rinse modules 402 are on one side and the four dry/anneal modules 404 are on the other side of the electrofill system 430. Different configurations of the modules may be more efficient in processing wafers quickly. For example, minimizing the transfer distance and/or time between two modules may aid in processing wafers quickly.

Similar to the modules in the electrofill system 400, the modules in the electrofill system 430 may include apparatus for different operations. For example, the four plate/rinse modules 402 may instead be plate modules and the four dry/anneal modules may instead be rinse/dry/anneal modules.

Figure 4D:
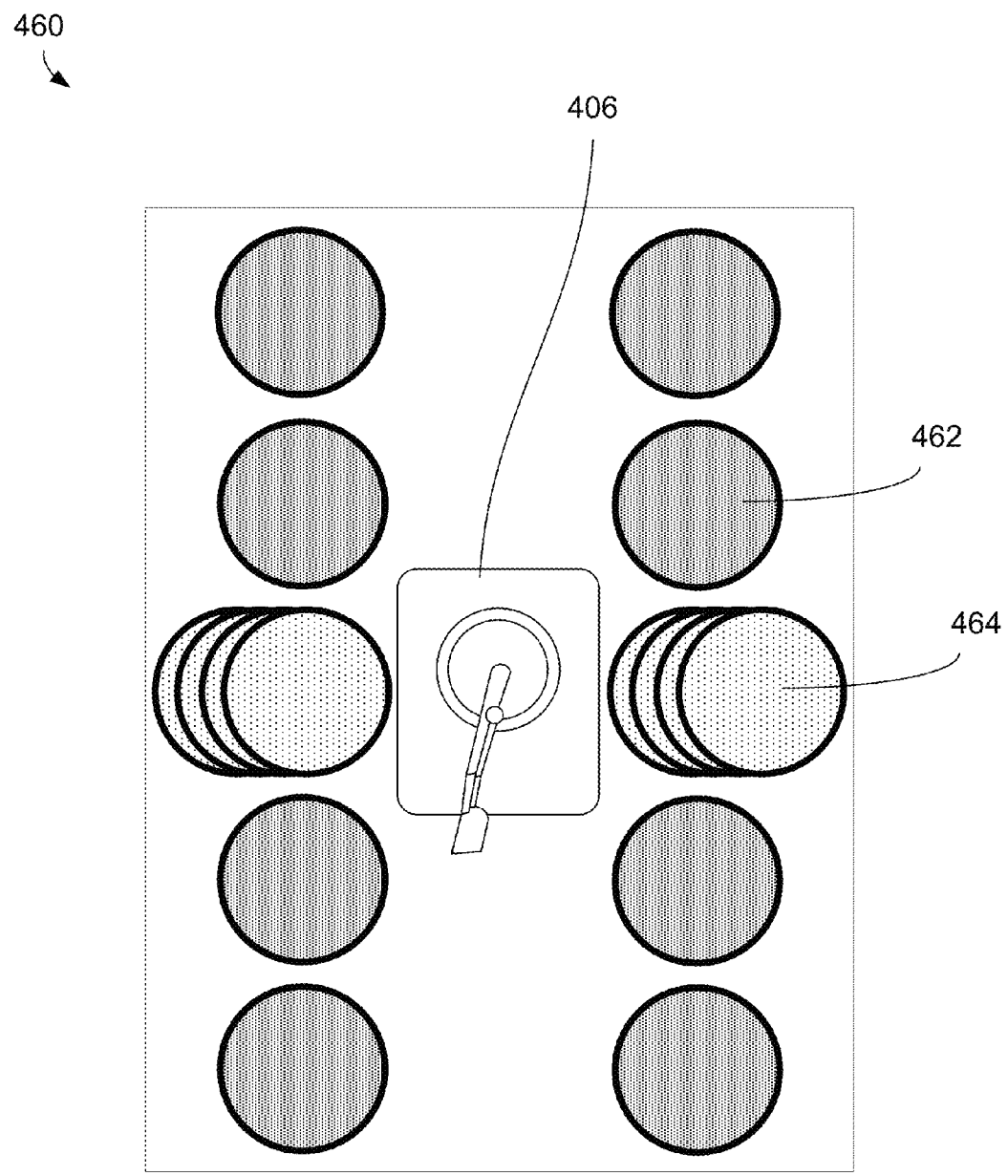

The electrofill system 460 shown in FIG. 4D includes eight plate/rinse/dry modules 462 and eight anneal modules 464. The electrofill system 460 also includes a hand-off tool 406. The eight plate/rinse/dry modules may each include apparatus configured to plate the wafer, rinse the wafer, and dry the wafer. The eight anneal modules may each include apparatus configured to anneal the wafer. As shown, the anneal modules 464 are in two sets of anneal modules, with each set of anneal modules including four anneal modules stacked on top of one another.

Figure 4E:
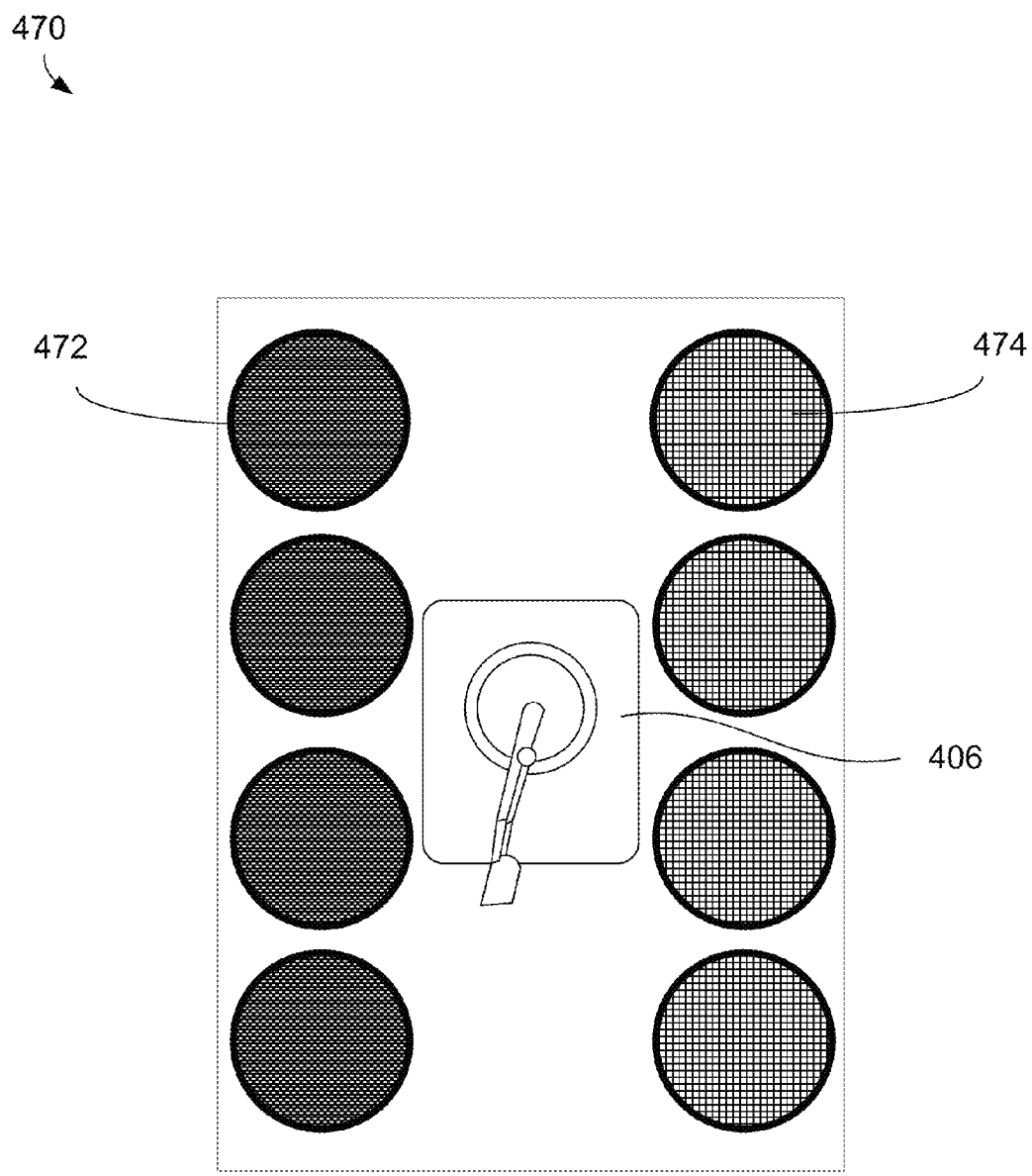

The electrofill system 470 shown in FIG. 4E includes four plating modules 472 and four rinse/dry/anneal modules 474. The electrofill system 470 also includes a hand-off tool 406. The four plating modules may each include apparatus configured to plate the wafer. The four rinse/dry/anneal modules may each include apparatus configured to rinse the wafer, dry the wafer, and anneal the wafer.

Figure 4F:
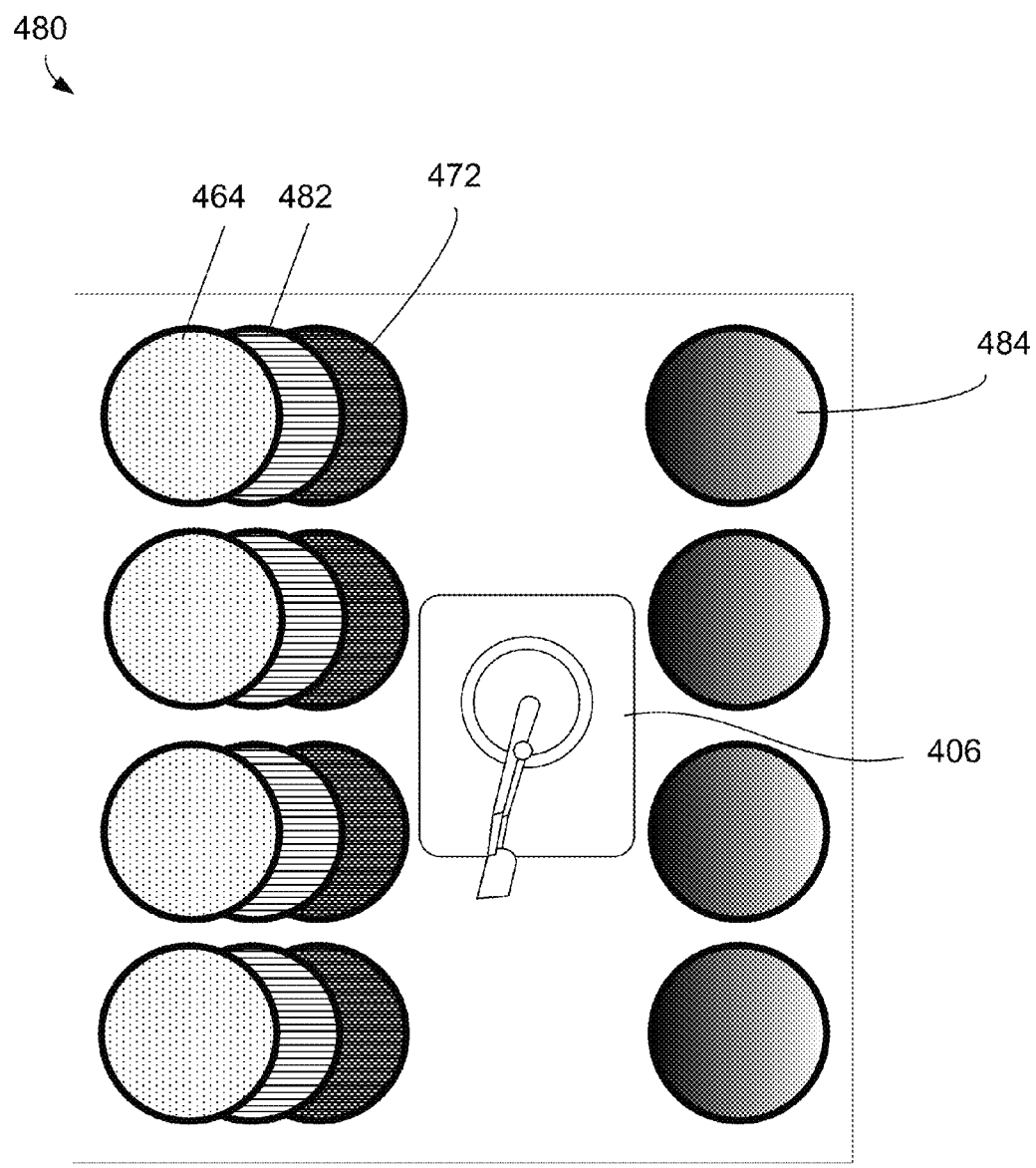

The electrofill system 480 shown in FIG. 4F includes four plating modules 472, four anneal modules 464, four rinse/dry modules 482, and four over-burden plating modules 484. The electrofill system 480 also includes a hand-off tool 406. As shown, a plating module 472, a rinse/dry module 482, and an anneal module 464 are stacked on top of one another, forming four sets of these modules. A plating module 472 may be used for plating copper that will be redistributed with an anneal in the anneal module 464, as described herein. An over-burden plating module 484 may be used for plating a bulk-layer of copper, as also described herein.

Figure 4G:
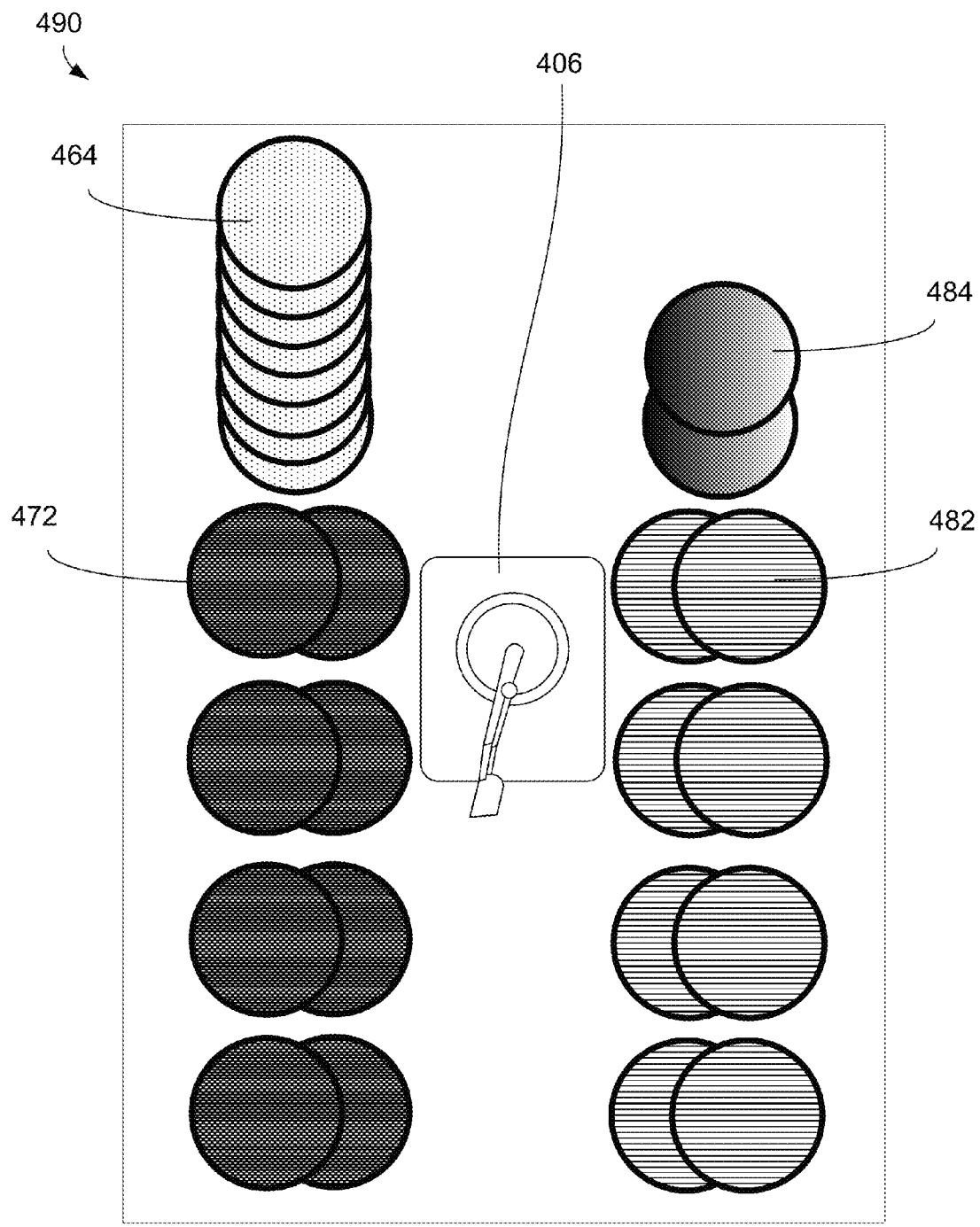

The electrofill system 490 shown in FIG. 4G includes eight plating modules 472, eight anneal modules 464, eight rinse/dry modules 482, and two over-burden plating modules 484. The electrofill system 480 also includes a hand-off tool 406. As shown, two plating modules 472 are stacked on top of one another, forming four sets of these modules. A plating module 472 may be used for plating copper that will be redistributed with an anneal in the anneal module 464, as described herein. Two rinse/dry modules 482 also are stacked on top of one another, forming four sets of these modules. The eight anneal modules 464 are all stacked on top of one another, forming one stack of these modules. The two over-burden plating modules 484 also are stacked on top of one another, forming one stack of these modules. An over-burden plating module 484 may be used for plating a bulk-layer of copper, as also described herein.

In some implementations of the methods described above, copper is plated onto a liner layer having a high sheet resistance. For example, a thin ruthenium layer may have a sheet resistance of about 100 to 200 ohm/square. The sheet resistance of a layer increases as its thickness decreases. When the sheet resistance of a layer is high, a voltage drop (termed the terminal effect) exists between the edge of the wafer, where electrical contact is made in an electroplating apparatus, and the center of the wafer. This resistive drop persists during an electroplating process until sufficient plating increases the conductance across the wafer and reduces the voltage drop. The resistive drop results in a larger voltage driving the electroplating reaction near the wafer edge, and thus a faster plating rate at the wafer edge. As a result, the plated layer may have a concave profile with an increased thickness near the edge of the wafer relative to its center. This terminal effect may substantially increase the plated layer thickness near the wafer edge for wafers having seed layers or liner layers with sheet resistances greater than about 1 ohm/square, and may result in progressively greater edge thickness as the sheet resistance increases further. Generally, the impact of the terminal effect in generating thickness variation is mostly concentrated in the outer 15 to 30 mm of the wafer diameter.

When electroplating on a surface having a high sheet resistance, an electroplating solution with a low conductivity may be used. When the electroplating solution conductivity is decreased, the relative voltage drop between the wafer center and wafer edge compared to the overall voltage drop through the electroplating vessel becomes small. The thickness distribution of the plated metal is improved because the voltage driving the reaction at the wafer edge is not much larger relative to that at the wafer center. A low conductivity (high resistivity) electroplating solution has a resistivity higher than about 200 ohm-cm or higher than about 1000 ohm-cm in some implementations, which is significantly higher than a conventional electroplating solution resistivity of about 2 to 20 ohm-cm. An electroplating solution can only have a resistivity up to a certain level and still contain enough copper so that copper may be plated with the electroplating solution, however.

Other ways to reduce the terminal effect include adding auxiliary cathodes, shielding, and resistive elements to an electroplating apparatus. All of these devices and techniques are discussed further, below.

Figure 5:
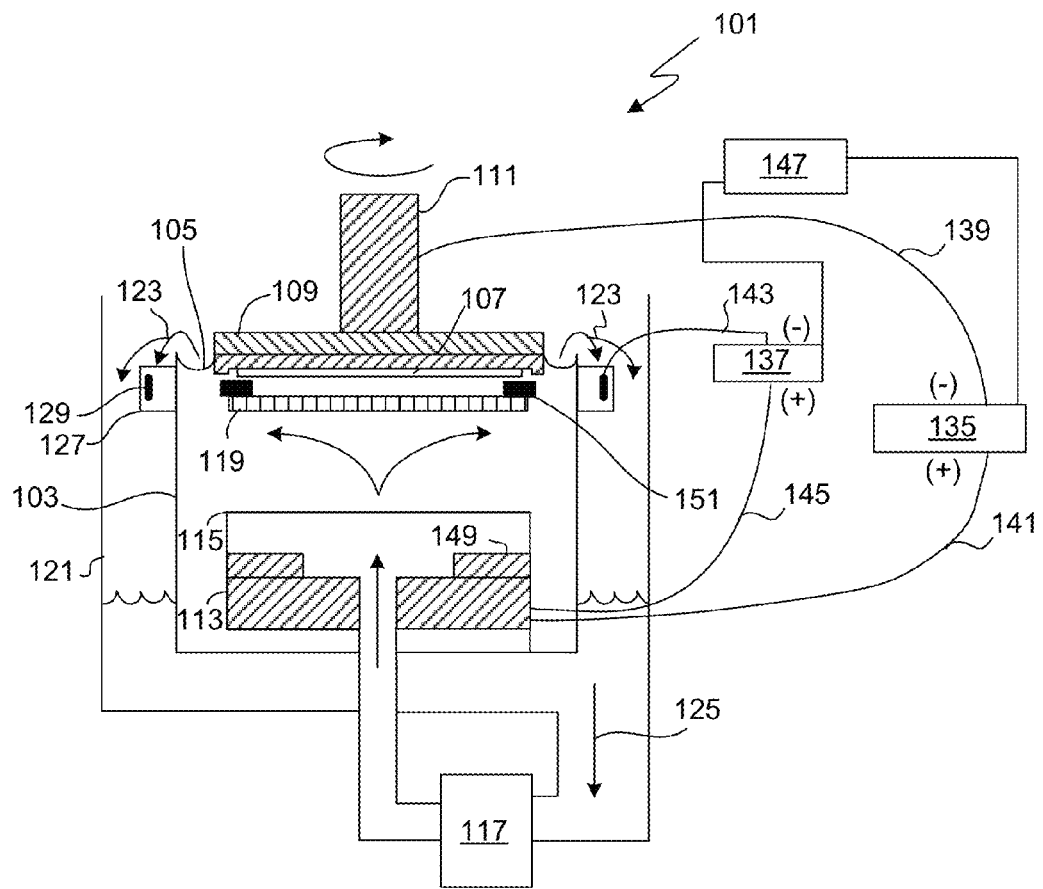
FIG. 5 shows an example of a cross-sectional schematic diagram of an electroplating apparatus.

FIG. 5 shows an example of a cross-sectional schematic diagram of an electroplating apparatus. The electroplating apparatus 101 could be included in any one of the electrofill modules or plating modules described above. The electroplating apparatus 101 includes a plating vessel 103 that contains the electroplating solution, which is shown at a level 105. A wafer 107 may be immersed in the electroplating solution and be held by a "clamshell" holding fixture 109, mounted on a rotatable spindle 111. The rotatable spindle allows for rotation of clamshell 109 together with the wafer 107. Clamshell-type electroplating apparatus are further described U.S. Pat. No. 6,156,167 and U.S. Pat. No. 6,800,187, both of which are herein incorporated by reference. Of course, wafer holders other than clamshell-type fixtures may be employed.

An anode 113 is disposed below the wafer 107 within the electroplating vessel 103 and is separated from the wafer region by an anode membrane 115, which is an ion selective membrane in some implementations. The region below the anode membrane is often referred to as an "anode chamber" and electrolyte within this chamber as "anolyte." The anode membrane 115 allows ionic communication between the anodic and cathodic regions of the electroplating vessel, while preventing any particles generated at the anode from entering the proximity of the wafer and contaminating it. The anode membrane may also be useful in redistributing current flow during the electroplating process and thereby improve the plating uniformity. Anode membranes are further described in U.S. Pat. No. 6,126,798 and U.S. Pat. No. 6,569,299, both of which are herein incorporated by reference.

The electroplating solution may be continuously provided to electroplating vessel 103 by a pump 117. Generally, the electroplating solution flows upwards through an anode membrane 115 and a resistive element 119 to the center of wafer 107 and then radially outward and across the wafer. In some implementations, the electroplating solution may be provided into the anodic region of the electroplating vessel 103 from the side of the electroplating vessel. In some implementations, the electroplating solution may be supplied through separate inlets into anodic and cathodic regions of the plating vessel.

The resistive element 119 is located in close proximity of the wafer (within about 10 millimeters or about 3 to 8 millimeters, in various implementations) and serves as a constant current source to the wafer. That is, the resistive element 119 shapes the electrolyte current near the wafer to provide a relatively uniform current distribution over the wafer face. The element contains a plurality of one-dimensional through holes, as described further below. Further details regarding resistive elements may be found in U.S. patent application Ser. No. 12/291,356, titled "METHOD AND APPARATUS FOR ELECTROPLATING," and filed Nov. 7, 2008, which is herein incorporated by reference.

The electroplating solution then overflows the electroplating vessel 103 to an overflow reservoir 121, as indicated by arrows 123. The electroplating solution may be filtered (not shown) and returned to pump 117, as indicated by arrow 125, completing the recirculation of the electroplating solution.

A second cathode (i.e., a thief cathode) chamber 127, containing a second cathode 129, may be located on the outside of the electroplating vessel 103 and peripheral to the wafer. Generally, the second cathode can be positioned at a number of locations within the electroplating vessel or outside the electroplating vessel.

In some implementations, the electroplating solution overflows a weir wall of the electroplating vessel 103 into the second cathode chamber 127. In some implementations, the second cathode chamber 127 is separated from the electroplating vessel 103 by a wall having multiple openings covered by an ion-permeable membrane. The membrane allows ionic communication between the electroplating vessel 103 and the second cathode chamber 127, thereby allowing current to be diverted to the second cathode. The porosity of the membrane may be such that it does not allow particulate material to cross from the second cathode chamber 127 to the electroplating vessel 103 and result in wafer contamination. The openings in the walls may take the form of rounded holes, slots, or other shapes of various sizes. In one implementation, the openings are slots having dimensions of, e.g., about 12 millimeters by 90 millimeters. Other mechanisms for allowing fluidic and/or ionic communication between the second cathode chamber and the electroplating vessel are possible. Examples include designs in which the membrane, rather than an impermeable wall, provides most of the barrier between the electroplating solution in the second cathode chamber and the electroplating solution in the electroplating vessel. A rigid framework may provide support for the membrane in such implementations.

Two DC power supplies 135 and 137 can be used to control current flow to the wafer 107 and to the second cathode 129 respectively. A power supply 135 has a negative output lead 139 electrically connected to the wafer 107 through one or more slip rings, brushes, or contacts (not shown). The positive output lead 141 of the power supply 135 is electrically connected to the anode 113 located in electroplating vessel 103. The power supply may have an output voltage of up to about 250 volts, for example. Similarly, a power supply 137 has a negative output lead 143 electrically connected to the second cathode 129, and a positive output lead 145 electrically connected to the anode 113. Alternatively, one power supply with multiple independently controllable electrical outlets can be used to provide different levels of current to the wafer and to the second cathode.

The power supplies 135 and 137 may be connected to a controller 147, which allows modulation of current and potential provided to the elements of the electroplating apparatus 300. For example, the controller may allow electroplating either in current-controlled or potential-controlled regimes. The system controller 330 may include program instructions specifying current and voltage levels that need to be applied to various elements of the electroplating apparatus, as well as times at which these levels need to be changed. For example, it may include program instructions for transitioning from potential-control to current-control upon immersion of the wafer into the electroplating solution.

During use, the power supplies 135 and 137 bias both the wafer 107 and the second cathode 129 to have a negative potential relative to the anode 113. This causes an electrical current flowing from anode 113 to the wafer 107 to be partially or substantially diverted to the second cathode 129.

The electrical circuit described above may also include one or several diodes that will prevent reversal of the current flow, when such reversal is not desired. An undesired current feedback may occur during electroplating processes, since the anode 113, which is set at ground potential, is the common element of both the wafer circuit and the second cathode circuit.

The level of current applied to the second cathode 129 is typically set to lower values than the level of current applied to the wafer 107, with the second cathode current being presented as a percentage of the wafer current. For example, a 10% second cathode current corresponds to a current flow at the second cathode that is 10% of the current flow to the wafer. The direction of the current as used herein is the direction of net positive ion flux. During electroplating, an electrochemical reduction (e.g. $Cu^2+2e^-=Cu^0$) occurs both on the wafer surface and on the second cathode surface, which results in the deposition of copper on the surfaces of both the wafer and the second cathode. Since the current is diverted from the wafer to the second cathode, the thickness of deposited copper layer at the edge of the wafer may be diminished. This effect typically occurs in the outer 20 millimeters of the wafer, and is especially pronounced in its outer 10 millimeters, particularly when electroplating is performed on a liner layer or a thin seed layer. The use of the second cathode 129 can substantially improve center-edge nonuniformity resulting from terminal and field effects. A second cathode can be used either alone or in combination with further auxiliary cathodes or with a variety of fixed or dynamic shields.

Further details regarding auxiliary cathodes, including secondary and tertiary cathodes, can be found in U.S. patent application Ser. No. 12/481,503, titled "METHOD AND APPARATUS FOR ELECTROPLATING," and filed Jun. 9, 2009, which is herein incorporated by reference. It should be understood that the auxiliary cathode and its associated power supplies are optional features.

One or more shields, such as 149, can be positioned within the electroplating vessel between the resistive element 119 and the anode 113 (e.g., below the resistive element in wafer-facing-down systems). The shields are usually ring-shaped dielectric inserts, which are used for shaping the current profile and improving the uniformity of electroplating, such as those described in U.S. Pat. No. 6,027,631, which is herein incorporated by reference. Other shield designs and shapes may be employed as are known to those of skill in the art.

In general, the shields may take on any shape including that of wedges, bars, circles, ellipses, and other geometric designs. Ring-shaped inserts may also have patterns at their inside diameter, which may improve the ability of the shield to shape the current flux in the desired fashion. The function of the shields may differ, depending on their position in the electroplating vessel. The apparatus can include any of the static shields, as well as variable field shaping elements, such as those described in U.S. Pat. No. 6,402,923 and U.S. Pat. No. 7,070,686, both of which are herein incorporated by reference. An apparatus can also include any of the segmented anodes, such as described in U.S. Pat. No. 6,497,801, or concentric anodes, such as described in U.S. Pat. Nos. 6,755,954 and 6,773,571, all of which are herein incorporated by reference. While shielding inserts may be useful for improving electroplating uniformity, in some implementations they may not be used, or alternative shielding configurations may be employed.

Shields, such as shield 151, may be positioned within the electroplating vessel between the resistive element 119 and the wafer 107. In some implementations, a shield may reside about the perimeter of the resistive element to further improve edge-center plating uniformity. In some implementations, a shield may reside directly on the resistive element. In some implementations, a shield may be positioned between the resistive element and the wafer to block a path between at least some of the perforations at a peripheral region of the element and the wafer.

Resistive Element

In some implementations, a resistive element 119 may be a microporous plate or disk having a continuous three-dimensional network of pores (e.g., a plate made of sintered particles of a ceramic or a glass). A porous plate having three-dimensional pore networks includes intertwining pores through which ionic current can travel both vertically up through the plate in the general direction of the anode to wafer, as well as laterally (e.g., from the center to the edge of the plate). Examples of suitable designs for such plates are described in U.S. Pat. No. 7,622,024, which is herein incorporated by reference.

In some implementations, a resistive element 119 may include pores or channels that provide paths though the resistive element that do not substantially communicate with one another within the body of the element. Such pores of channels may be linear or non-linear. Such pores or channels may also be parallel or not be parallel to the direction of the ionic current flow.

In some implementations, a resistive element 119 may include linear pores or channels that are generally parallel to the direction of the ionic current flow and do not substantially communicate with one another within the body of the element (i.e., one-dimensional through-holes in the resistive element). Such a pore or channel configuration minimizes the lateral movement of the ionic current in the element. Ionic current flows in a manner that is one-dimensional, i.e., substantially in the vector direction that is normal to the closest plated surface (e.g., the wafer 107) near the resistive element. Such a resistive element is referred to as a one-dimensional resistive element.

A resistive element including one-dimensional through-holes (also referred to as a one-dimensional porous high resistance virtual anode or HRVA) is typically a disk (other shapes may also be used) made of an ionically resistive material having a plurality of holes drilled (or otherwise made) through it. The holes do not form communicating channels within the body of the disk and typically extend through the disk in a direction that is substantially normal to the surface of the wafer. A variety of ionically resistive materials can be used for the disk body, including polycarbonate, polyethylene, polypropylene, polyvinylidene diflouride (PVDF), polytetrafluoroethylene, polysulphone, and the like. In some implementations, the disk materials are resistant to degradation in an acidic electrolyte environment, relatively hard, and easy to process by machining.

In some implementations, the resistive element may be in close proximity to the work piece and dominate the overall resistance of the electroplating apparatus. When the resistive element is sufficiently resistive relative to the work piece sheet resistance, the resistive element can approximate a uniform distribution current source. Generally, the higher the sheet resistance of the layer being plated onto, the higher the resistance of the resistive element or the higher the resistivity of the electroplating solution needed to aid in mitigating the terminal effect. With a high resistance resistive element, a lower resistivity electrolyte may be used, in some implementations, and vice versa.

By keeping the work piece close to the resistive element, the ionic resistance from the top of the element to the surface of the work piece is much less than the ionic path resistance from the center-top of the element to the work piece edge, substantially compensating for the sheet resistance in a seed layer of a liner layer and directing a significant amount of current over the center of the work piece. Details associated with using a resistive element in close proximity to the wafer are discussed further in U.S. patent application Ser. No. 11/040,359.

Regardless of whether the resistive element permits one or more dimensional current flow, in some implementations it may be co-extensive with the work piece. Therefore, when the work piece is a wafer, the resistive element has a diameter that is typically close to the diameter of the wafer that is being plated. For example, the resistive element diameter can be about 150 to 450 millimeters in diameter, with about a 200 millimeter resistive element being used for a 200 millimeter wafer, about a 300 millimeter resistive element for a 300 millimeter wafer, and about a 450 millimeter resistive element for a 450 millimeter wafer, and so forth. In instances where the wafer has a generally circular shape but has irregularities at the edge, e.g., notches or flat regions where the wafer is cut to a chord, a disk-shaped resistive element can still be used, but other compensating adjustments can be made to the electroplating apparatus, as described in U.S. patent application Ser. No. 12/291,356.

In some implementations, the resistive element has a diameter that is greater than the diameter of the wafer to be plated (e.g., greater than 200 millimeters or 300 millimeters), and has an outer edge portion that is hole-free (in the case of a one-dimensional resistive element). Such an edge portion can be used to create a small gap about the periphery of the wafer (a peripheral gap between the resistive element edge portion and either the wafer edge or the bottom of a wafer-holding cup), and to assist in mounting the resistive element within the plating vessel. In some implementations, the size of the hole-free resistive element edge is about 5 to 50 millimeters from the outer edge of the resistive element to the edge of the portion of the resistive element that has holes.

In some implementations of a one-dimensional resistive element, the number of through-holes in the element may be large, with the diameter of each hole being small. Generally, the diameter of each hole may be less than about one quarter of the gap between the resistive element and the work piece. In some implementations, the number of holes may be about 5,000 to 12,000. In some implementations, each hole (or at least 95% of holes) may have a diameter (or other principal dimension) of less than about 5 millimeters of less than about 1.25 millimeters.

Figure 6A:
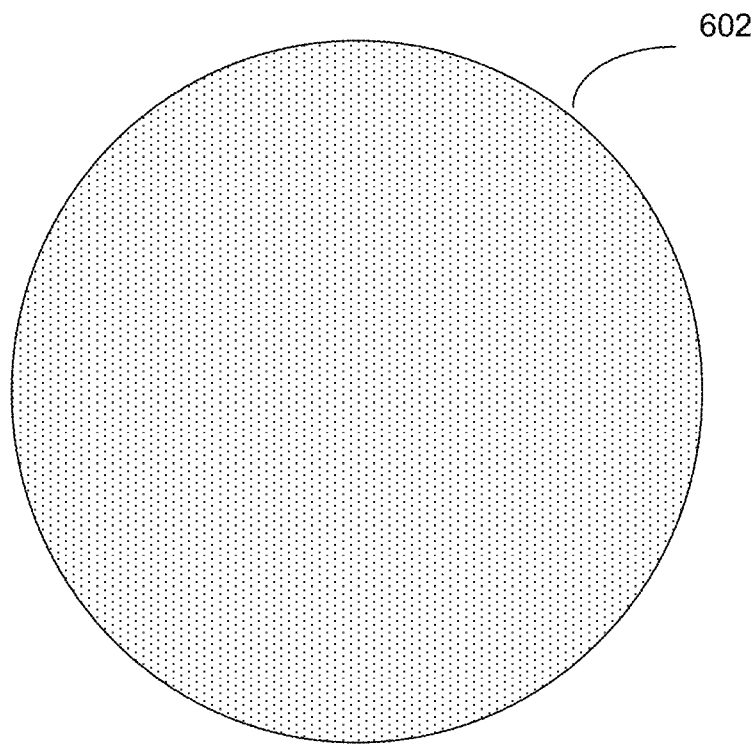
FIGS. 6A and 6B show examples of views of a one-dimensional resistive element.
Figure 6B:
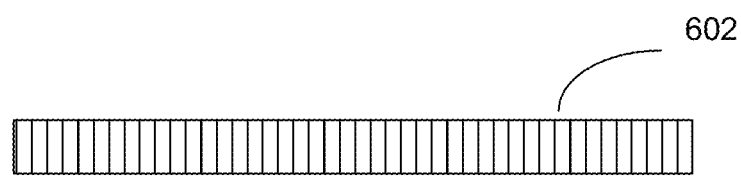

FIGS. 6A and 6B show examples of views of a one-dimensional resistive element. FIG. 6A shows an example of a top view of a resistive element 602, illustrating a top surface of the resistive element. The resistive element 602 includes a large number of small-diameter openings, shown as black dots. FIG. 6B shows an example of a cross-sectional view of the resistive element 602. As shown in FIG. 6B, the through-holes are substantially perpendicular to the top and bottom surfaces of the resistive element.

In some implementations, the thickness of the resistive element is about 5 to 50 millimeters, e.g., about 10 to 25 millimeters or about 10 to 20 millimeters. In some implementations, the thickness of the resistive element is less than about 15% of the wafer diameter.

The resistance of a resistive element in an electroplating apparatus for a given electroplating solution depends on a number of parameters, including the thickness of the resistive element and the porosity of the resistive element. The porosity of the resistive element may be defined by the area occupied by openings of the holes on the surface of the resistive element divided by the area occupied by the surface of the resistive element. Note that this area occupied by the surface of the resistive element is the active area, i.e., the area in contact with the electrolyte, and does not include regions of the resistive element used for mounting or holding the resistive element in an electroplating apparatus. In some implementations, the porosity of a resistive element may be about 1 to 5% or about 1 to 3%.

In some instances, a high resistance resistive element may be used in applications where the terminal effect is large. For example, a high resistance resistive element may be particularly useful when the sheet resistance of the surface being plated is about 100 to 200 ohm/square. In implementations of the methods described above, the terminal effect may be large when plating copper directly onto a liner layer. One such liner layer may be ruthenium, for example.

The resistance of the resistive element may be determined by determining the resistance of the electroplating solution in the volume to be occupied by the resistive element. For example, the resistive element for electroplating a 300 millimeter wafer may include an active region of 288 millimeters in diameter (active area of 652 $cm^2$) and be 1.27 cm thick. Thus, the resistance of an electroplating solution having a resistivity of 1250 ohm-centimeters ($\Omega$-cm) for the volume to be occupied by the resistive element is (1250 $\Omega$-cm)*(1.27 cm)/(652 $cm^2$), or 2.43$\Omega$ With a resistive element in an electroplating apparatus having a porosity of 2.43%, only 2.43% of the volume without the resistive element in place is available for conduction. Thus, the resistance of the resistive element is (2.43$\Omega$)/(2.43%), or 100.1$\Omega$.

Table 1 includes the resistance of some exemplary one-dimensional resistive elements having an active region of 288 millimeters in diameter for a 1250 $\Omega$-cm electroplating solution.

TABLE 1

Resistance of exemplary one-dimensional resistive elements.

| | # of holes | hole diameter (mm) | thickness (cm) | percent porosity | resistance of volume with no resistive element (ohms) | resistance of the resistive element (ohms) |
|---|---|---|---|---|---|---|
| 1X | 9465 | 0.66 | 1.27 | 4.97 | 2.43 | 49.0 |
| 2X | 6465 | 0.56 | 1.27 | 2.43 | 2.43 | 100.1 |
| 4X | 5981 | 0.51 | 1.91 | 1.86 | 3.65 | 196.4 |

In some implementations, the resistance of a resistive element (assuming a resistive element for electroplating a 300 millimeter wafer substrate used at a distance of about 3 to 8 millimeters from the wafer substrate surface) is about 25 to 250 ohms ($\Omega$), about 25 to 75$\Omega$, about 75 to 150$\Omega$, or about 150 to 250$\Omega$.

A resistive element may also be characterized by its resistance divided by the active area of the face of the resistive element. Thus, a resistive element may have a resistance per area of about 0.04 to 0.4 $\Omega/cm^2$, about 0.04 to 0.1 $\Omega/cm^2$, about 0.1 to 0.2 $\Omega/cm^2$, or about 0.2 to 0.4 $\Omega/cm^2$.

An electroplating apparatus incorporating a high resistance resistive element may require a power supply with a relatively high output voltage to plate at a typical desired current level. For example, a power supply capable of providing an output voltage of about 50 volts or greater may be used with a high resistance resistive element such as the 2× resistive element in Table 1. More specifically, the power supply may be capable of providing an output voltage of about 100 to 175 volts (with 150 volts being a typical example). A power supply capable of providing even higher output voltage (e.g., about 150 to 250 volts) may be used with a resistive element having a higher resistance (e.g., the 4× resistive element in Table 1).

When plating copper onto ruthenium, the potential applied between the wafer and the cathode depends on the thickness of the ruthenium layer and the wafer diameter. For example, for a 300 millimeter wafer, a potential of about 75 volts may be used with the 2× resistive element in Table 1 when plating copper onto a 3 nanometer thick ruthenium layer, which yields about a 0.75 amp plating current. For 300 millimeter wafers having different ruthenium thicknesses on the surface of the wafers, a potential of about 70 to 120 volts may be used with the 2× resistive element in Table 1 when plating copper onto ruthenium, yielding a plating current of about 0.75 to 1.2 amps.

The resistance of a resistive element is generated by the low but continuously connected porosity through the thickness of the resistive element. In an electroplating solution, this may create a compact region of very high resistance that can be positioned in close proximity to the wafer surface. In contrast, a thick resistive element having lower and non-one-dimensional porosity may have the same resistance as the resistive elements disclosed herein, but the current diverting characteristics of such a thick resistive element may not be the same. Current within such a thick resistive element may tend to enter the central region of the element and flow radially outwards as it flows upwards.

Another important parameter of a one-dimensional resistive element is the ratio of a through-hole diameter (or other principal dimension) to the distance of the element from the wafer. It was discovered experimentally and subsequently verified by computer modeling that this ratio should be approximately 1 or less (e.g., less than about 0.8, or less than about 0.25). In some implementations, this ratio is about 0.1 for providing good electroplating uniformity performance. In other words, the diameter of the holes may be equal to or smaller than the distance from the resistive element to the work piece. If the hole diameter is larger than the wafer-to-resistive element distance, a hole may leave its individual current image or "footprint" on the plated layer above it, thereby leading to small scale non-uniformities in the plated layer. The hole diameter values recited above refer to the diameter of the hole opening measured on the resistive element face that is proximal to the wafer. In some implementations, the hole diameter on both proximal and distal faces of resistive element is the same, but holes can also be tapered.

While resistive element shown in FIG. 6A has a uniform distribution of holes, in other implementations the resistive element may have regions with non-uniform distribution of holes, or with holes that are blocked to create a non-uniform distribution of holes. Such a hole distribution may direct more current to the center of the work piece so that a high sheet resistance layer may be more uniformly plated. A very thick film having a low sheet resistance, however, may tend to plate more non-uniformly if a non-uniform hole distribution is used. The blocked or missing holes may be non-uniform in the radial, azimuthal, or both directions.

In some implementations, the resistive element is positioned substantially parallel to the work piece surface and anode surface, and the one-dimensional holes are oriented parallel to the direction between the wafer surface and anode surface. In other implementations, at least some of the holes have their relative angle modified to change the hole length relative to the element thickness, and thereby modify the local contribution of the holes to the resistance.

It should be noted that a one-dimensional porous resistive element is distinct from a so-called diffuser plate. The main function of a diffuser plate is to distribute flow of an electrolyte, rather than to provide significant electrical resistance. Diffuser plates typically have openings that constitute a much larger net porosity (in the range of from 25 to 80 percent), which is adequate to achieve a substantially uniform electrolyte flow through a significant viscous flow resistance, and generally have a smaller, often insignificant, overall contribution to resistance of the electroplating apparatus. In contrast, a one-dimensional resistive element may significantly increase the resistance of the electroplating apparatus, as may be needed for improving electroplating uniformity.

Experimental

In one process, 10 nanometers of copper was plated on a Ru liner layer. The copper layer was plated with a method similar to the methods described in U.S. Pat. No. 7,799,684. The copper layer was then rinsed and dried. The copper layer was annealed in forming gas at about 300° C. The process was repeated three more times; i.e., four cycles of the process operations were performed.

A scanning electron microscopy (SEM) micrograph of a cross-section of the wafer showed that the process operations fully filled features with widths of about 30 to 60 nanometers. Little or no copper remained on the field regions of the wafer near the features due to the redistribution of copper into the features. In regions of the wafer that did not include any features, the copper remained in the field regions.

In another process, 10 nanometers of copper was plated on a Ru barrier layer. The copper layer was plated with a method similar to the methods described in U.S. Pat. No. 7,799,684. The copper layer was then rinsed and dried. The copper layer was annealed in a forming gas at about 200° C. The process was repeated three more times; i.e., four cycles of the process operations were performed.

A SEM micrograph of a cross-section of the wafer showed that the process operations partially filled features having widths of about 60 nanometers. Some copper remained on the field regions of the wafer. In regions of the wafer that did not include any features, the copper remained in the field regions.

Further Implementations

The apparatus and methods described herein also may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate, furnace, or UV curing tool; (3) exposing the photoresist to visible, UV, or x-ray light with a tool such as a wafer stepper; (4) developing the resist so as to selectively remove resist and thereby pattern it using a tool such as a wet bench; (5) transferring the resist pattern into an underlying film or work piece by using a dry or plasmaassisted etching tool; and (6) removing the resist using a tool such as an RF or microwave plasma resist stripper.

What is claimed is:

1. An apparatus comprising:
    a plating chamber configured to hold an electrolyte;
    a wafer substrate holder configured to hold a wafer substrate in the plating chamber, the wafer substrate including a surface having edge regions, field regions, and a feature; and
    a controller including program instructions comprising:
        (a) instructions for electroplating a copper layer onto the surface of the wafer substrate using the plating chamber, wherein the electroplating is performed in an electroplating solution having a resistivity higher than about 200 ohm-cm;
        (b) instructions for annealing the copper layer, wherein the annealing reflows the copper in the copper layer and causes redistribution of the copper from the field regions of the wafer substrate to the feature; and
        (c) instructions for repeating instructions (a) and (b) at least two times until an aspect ratio of the feature is reduced to less than a predetermined value.

2. The apparatus of claim 1, further comprising:
    an element including an ionically resistive body with perforations in the body such that the perforations do not form communicating channels within the body, wherein the perforations allow for transport of the electrolyte through the element, wherein the element is positioned to have a surface facing the surface of the wafer substrate.

3. The apparatus of claim 2, wherein:
    the surface of the element having the ionically resistive body is located within about 10 millimeters from said surface of the wafer substrate when the wafer substrate is held by the wafer substrate holder; and
    substantially all the perforations in the ionically resistive body have a principal dimension of an opening on the surface of the element facing the surface of the wafer substrate of no greater than about 5 millimeters, and wherein the porosity of the element is about 1 to 3%.

4. A system comprising the apparatus of claim 3 and a stepper.

5. The apparatus of claim 1, wherein the annealing the copper layer is at a temperature of about 150 to 400° C.

6. The apparatus of claim 1, wherein the annealing the copper layer is for a duration of about 30 to 180 seconds.

7. The apparatus of claim 1, wherein the annealing the copper layer is performed in a reducing atmosphere.

8. The apparatus of claim 7, wherein the reducing atmosphere is selected from the group consisting of forming gas, atomic hydrogen, and other chemical reducing agents.

9. The apparatus of claim 1, wherein the surface of the wafer includes a liner layer over the field regions and the feature.

10. The apparatus of claim 9, wherein the program instructions of the controller further comprise:
    instructions for annealing the liner layer in a reducing atmosphere prior to electroplating the copper layer.

11. The apparatus of claim 9, wherein the liner layer is selected from the group consisting of ruthenium (Ru), cobalt (Co), tungsten (W), osmium (Os), platinum (Pt), palladium (Pd), gold (Au), and rhodium (Rh).

12. The apparatus of claim 1, wherein the copper layer includes a copper alloying element.

13. The apparatus of claim 1, wherein the copper layer is about 2 to 20 nanometers thick.

14. The apparatus of claim 1, wherein the program instructions of the controller further comprise:
    instructions for electroplating copper onto the copper layer to fill the feature after the annealing causes redistribution of the copper from the field regions of the wafer substrate to the feature such that an aspect ratio of the feature is about 2:1 or less.

15. The apparatus of claim 1, wherein the predetermined value of the aspect ratio of the feature is about 2:1 or less.

16. The apparatus of claim 1, wherein the program instructions of the controller further comprise:
    instructions for repeating operations (a) and (b) about 2 to 8 times.

17. The apparatus of claim 1, wherein the program instructions of the controller further comprise:
    instructions for electroplating a copper alloy layer onto the copper layer after annealing the copper layer.

18. The apparatus of claim 1, wherein the copper layer is continuous.

19. The apparatus of claim 1, wherein the electroplating is performed at a temperature of about room temperature.

20. The apparatus of claim 1, wherein the electroplating is performed at a temperature of about 50 to 90° C.

21. The apparatus of claim 1, wherein the annealing is performed in a reducing atmosphere at a temperature of about 150 to 400° C. for a duration of about 30 to 180 seconds.

22. The apparatus of claim 1, wherein the electroplating is performed in an electroplating solution having a resistivity higher than about 1000 ohm-cm.

23. A non-transitory computer machine-readable medium having program instructions for control of an apparatus, the program instructions comprising:
    (a) instructions for transporting a wafer substrate to modules associated with the apparatus, the wafer substrate including a surface with field regions and a feature;
    (b) instructions for electroplating a copper layer onto the surface of the wafer substrate, wherein the electroplating is performed in an electroplating solution having a resistivity higher than about 200 ohm-cm;
    (c) instructions for annealing the copper layer, wherein the annealing reflows the copper in the copper layer and causes redistribution of the copper from the field regions of the wafer substrate to the feature; and
    (d) instructions for repeating instructions (b) and (c) at least two times until an aspect ratio of the feature is reduced to less than a predetermined value.

* * * * *